(12) United States Patent
Yun et al.

(10) Patent No.: US 10,490,584 B2
(45) Date of Patent: Nov. 26, 2019

(54) IMAGE SENSOR INCLUDING COLOR SEPARATION ELEMENT AND IMAGE PICKUP APPARATUS INCLUDING THE IMAGE SENSOR

(71) Applicant: SAMSUNG ELECTRONICS CO., LTD., Suwon-si (KR)

(72) Inventors: Seokho Yun, Hwaseong-si (KR); Sookyoung Roh, Seoul (KR); Sunghyun Nam, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 179 days.

(21) Appl. No.: 15/274,502

(22) Filed: Sep. 23, 2016

(65) Prior Publication Data

US 2017/0092676 A1  Mar. 30, 2017

(30) Foreign Application Priority Data

Sep. 25, 2015  (KR) ........................ 10-2015-0137096

(51) Int. Cl.
  *H01L 27/146* (2006.01)
  *H04N 9/04* (2006.01)
(52) U.S. Cl.
  CPC .. *H01L 27/14621* (2013.01); *H01L 27/14609* (2013.01); *H01L 27/14625* (2013.01); *H01L 27/14645* (2013.01); *H04N 9/045* (2013.01)
(58) Field of Classification Search
  CPC ........ H01L 27/14621; H01L 27/14625; G02B 27/1013; G02B 27/1073; G02B 27/1086
  See application file for complete search history.

(56) References Cited

U.S. PATENT DOCUMENTS

| 7,554,587 B2 | 6/2009 | Shizukuishi |
| 8,258,560 B1 | 9/2012 | Hynecek |
| 2002/0058353 A1 | 5/2002 | Merrill |

(Continued)

FOREIGN PATENT DOCUMENTS

| JP | 2007-109801 A | 4/2007 |
| JP | 5365667 B2 | 12/2013 |
| KR | 10-2016-0004641 A | 1/2016 |

OTHER PUBLICATIONS

Communication dated Feb. 14, 2017, issued by the European Patent Office in counterpart European Application No. 16189531.3.

*Primary Examiner* — Daniel Whalen
*Assistant Examiner* — Scott Stowe
(74) *Attorney, Agent, or Firm* — Sughrue Mion, PLLC

(57) ABSTRACT

An image sensor includes a first color separation element configured to separate an incident light, the incident light being separated into a mixture of a first color light and a third color light, and separated into a second color light; and a sensor array unit including a plurality of pixels configured to sense the separated incident light, the sensor array including a first pixel region and a second pixel region that are alternately arranged in a first direction and a second direction, the second direction crossing the first direction, wherein a stack of a first light sensing layer configured to sense the first color light and a third light sensing layer configured to sense the third color light is provided in the first pixel region, and a second light sensing layer configured to sense the second color light is provided in the second pixel region.

18 Claims, 23 Drawing Sheets

(56) References Cited

U.S. PATENT DOCUMENTS

| | | |
|---|---|---|
| 2009/0096900 A1 | 4/2009 | Pang et al. |
| 2009/0115011 A1 | 5/2009 | Ushiro et al. |
| 2010/0203666 A1 | 8/2010 | Endo et al. |
| 2011/0050941 A1* | 3/2011 | Hiramoto .......... H01L 27/14625 348/222.1 |
| 2011/0164156 A1* | 7/2011 | Hiramoto .......... H01L 27/14625 348/272 |
| 2011/0249158 A1 | 10/2011 | Hynecek |
| 2016/0006995 A1 | 1/2016 | Yun et al. |

\* cited by examiner

IMAGE SENSOR INCLUDING COLOR SEPARATION ELEMENT AND IMAGE PICKUP APPARATUS INCLUDING THE IMAGE SENSOR

CROSS-REFERENCE TO RELATED APPLICATION

This application claims priority from Korean Patent Application No. 10-2015-0137096, filed on Sep. 25, 2015, in the Korean Intellectual Property Office, the disclosure of which is incorporated herein in its entirety by reference.

BACKGROUND

1. Field

Apparatuses consistent with exemplary embodiments relate to image sensors that provide improved light use efficiency and/or improved color purity and image pickup apparatuses including the same.

2. Description of the Related Art

Recently, in order to increase the number of pixels in an image sensor, pixel miniaturization is desired accordingly. When the pixel miniaturization is performed, light intensity securement and noise removal are important issues.

A substantial loss of an optical signal occurs in a color filter layer. A color filter used in the image sensor is an absorption-type color filter. Accordingly, the color filter may have low light use efficiency because the color filter absorbs lights of colors other than desired colors. For example, when a red, green, and blue (RGB) color filter is used in an image sensor, only about one third of the incident light is transmitted through the RGB color filter and the remaining portion, that is, about two thirds of the incident light is absorbed in the RGB color filter. Therefore, the light use efficiency of the RGB color filter may be only about 33%.

Thus, in order to increase the light efficiency, a scheme is attempted to sense intensity of the color light in each pixel without using the color filter.

SUMMARY

One or more exemplary embodiments provide image sensors with improved light use efficiency.

Additional aspects will be set forth in part in the description which follows and, in part, will be apparent from the description, or may be learned by practice of the exemplary embodiments.

According to an aspect of an exemplary embodiment, there is provided an image sensor including: a first color separation element configured to separate an incident light, the incident light being separated into a mixture of a first color light and a third color light, and separated into a second color light; and a sensor array unit including a plurality of pixels configured to sense the separated incident light, the sensor array including a first pixel region and a second pixel region that are alternately arranged in a first direction and a second direction, the second direction crossing the first direction, wherein a stack of a first light sensing layer configured to sense the first color light and a third light sensing layer configured to sense the third color light is provided in the first pixel region, and a second light sensing layer configured to sense the second color light is provided in the second pixel region.

In the stack of the first light sensing layer and the third light sensing layer, a layer configured to sense a light having a shorter wavelength among the first light sensing layer and the third light sensing layer may be disposed at a position closer to the first color separation element.

The first color separation element may be disposed at a position facing the second pixel region, configured to allow the second color light to pass through the first color separation element and travel in a third direction toward the second pixel region, and configured to allow the mixture of the first color light and the third color light to pass through the first color separation element and travel in a fourth direction slanted with respect to the third direction.

The first color separation element, when viewed in a plan view, may have a rectangular shape.

A longitudinal side of the first color separation element, when viewed in the plan view, may extend along the first direction.

The first color separation element may include a plurality of first color separation elements, and a longitudinal side of a first color separation element, when viewed in the plan view, may be perpendicular to a longitudinal side of an adjacent first color separation element.

The first color separation element, when viewed in a plan view, may extend parallel to a diagonal direction of the second pixel region.

The first color separation element, when viewed in a plan view, may have a shape of a cross.

A first line and a second line forming the shape of the cross may extend in directions respectively parallel to the first direction and the second direction.

A first line and a second line forming the shape of the cross may extend in directions respectively parallel to a first diagonal direction and a second diagonal direction of the second pixel region.

The first color separation element may be disposed at a position facing the first pixel region, configured to allow the mixture of the first color light and the third color light to pass through the first color separation element and travel in a fifth direction toward the first pixel region, and configured to allow the second color light to pass through the first color separation element and travel in a sixth direction slanted with respect to the fifth direction.

The image sensor may further include a second color separation element disposed to face the first pixel region, configured to allow the mixture of the first color light and the third color light to pass through the second color separation element and travel in a seventh direction toward the first pixel region, and configured to allow the second color light to pass through the second color separation element and travel in an eighth direction slanted with respect to the seventh direction.

The first and second color separation elements, when viewed in a plan view, may have a rectangular shape.

Longitudinal sides of the first and second color separation elements, when viewed in the plan view, may be parallel to at least one of the first direction and the second direction.

A longitudinal side of the first color separation element, when viewed in the plan view, may be parallel to the first direction, and a longitudinal side of the second color separation element, when viewed in the plan view, may be parallel to the second direction.

Longitudinal sides of the first and second color separation elements may be respectively parallel to a diagonal direction of the second pixel region and a diagonal direction of the first pixel region.

The first and second color separation elements, when viewed in a plan view, may have a shape of a cross.

A first line and a second line forming the shape of the cross may extend in directions respectively parallel to the first direction and the second direction.

A first line and a second line forming the shape of the cross may extend in directions respectively parallel to a first diagonal direction and a second diagonal direction of the first pixel region.

According to another aspect of an exemplary embodiment, there is provided an image sensor including: a first color separation element configured to separate an incident light, the incident light being separated into a mixture of a first color light and a third color light, and separated into a second color light; and a sensor array unit including a plurality of pixels configured to sense the separated incident light, the sensor array including a first pixel region, a second pixel region, and a third pixel region that are alternately arranged in a first direction and a second direction, the second direction crossing the first direction, wherein a first light sensing layer configured to sense the first color light is provided in the first pixel region, a second light sensing layer configured to sense the second color light is provided in the second region, and a stack of a third light sensing layer configured to sense the third color light and a light absorbing layer configured to absorb the first color light is provided in the third pixel region, and wherein the first light sensing layer and the third light sensing layer are disposed to have different distances from the first color separation element.

In the first pixel region and the third pixel region, a layer configured to sense a light having a shorter wavelength among the first light sensing layer and the third light sensing layer may be disposed at a position closer to the first color separation element.

The first color separation element may be disposed at a position facing the second pixel region, configured to allow the second color light to pass through the first color separation element and travel in a third direction toward the second pixel region, and configured to allow the mixture of the first color light and the third color light to pass through the first color separation element and travel in a fourth direction slanted with respect to the third direction.

The first color separation element, when viewed in a plan view, may have a rectangular shape.

The first color separation element, when viewed in a plan view, may have a shape of a cross.

The first color separation element may be disposed at a position facing the first pixel region, configured to allow the mixture of the first color light and the third color light to pass through the first color separation element and travel in a fifth direction toward the first pixel region, and configured to allow the second color light to pass through the first color separation element and travel in a sixth direction slanted with respect to the fifth direction.

The image sensor may further include a second color separation element disposed to face the first pixel region, configured to allow the mixture of the first color light and the third color light to pass through the second color separation element and travel in a seventh direction toward the first pixel region, and configured to allow the second color light to pass through the second color separation element and travel in an eighth direction slanted with respect to the seventh direction.

The first and second color separation elements, when viewed in a plan view, may have a rectangular shape.

Longitudinal sides of the first and second color separation elements, when viewed in the plan view, may be parallel to at least one of the first direction and the second direction.

A longitudinal side of the first color separation element, when viewed in the plan view, may be parallel to the first direction, and a longitudinal side of the second color separation element, when viewed in the plan view, may be parallel to the second direction.

The first and second color separation elements, when viewed in the plan view, may have a shape of a cross.

According to another aspect of an exemplary embodiment, there is provided an image pickup apparatus including: a lens unit configured to generate an optical image based on a light reflected from an object; and the image sensor described above, wherein the image sensor is configured to convert the optical image into an electrical signal.

BRIEF DESCRIPTION OF THE DRAWINGS

The above and/or other aspects will be more apparent by describing certain example embodiments with reference to the accompanying drawings, in which.

DETAILED DESCRIPTION

Figure 1:
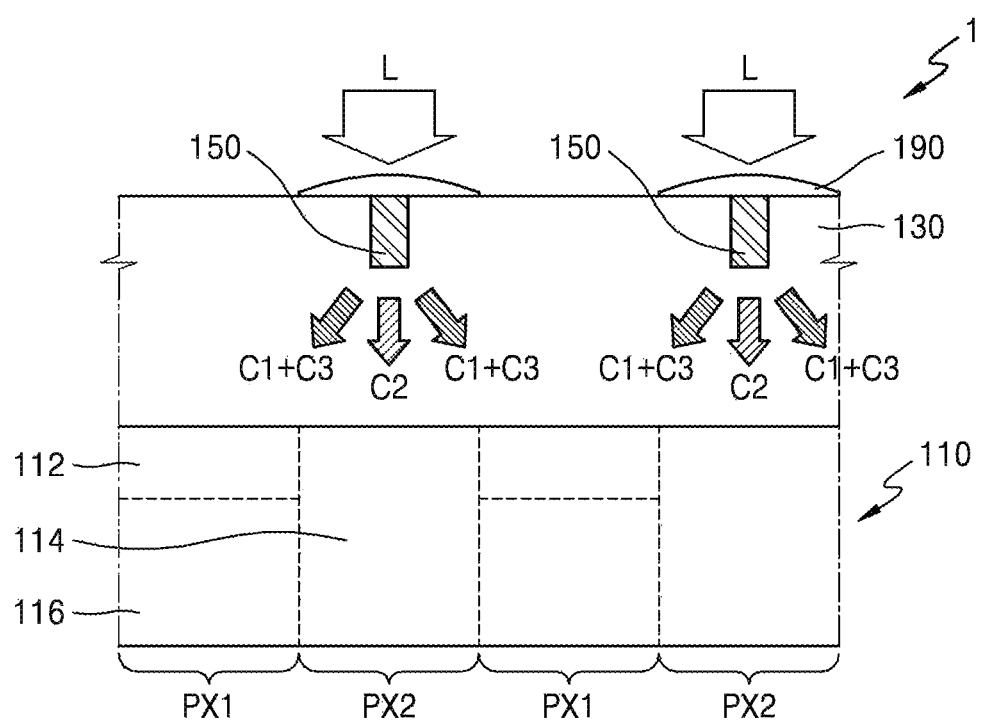
FIG. 1 is a cross-sectional view illustrating a schematic configuration of an image sensor according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The inventive concept may include various embodiments and modifications, and exemplary embodiments thereof are illustrated in the drawings and will be described herein in detail. The effects and features of the inventive concept and the accomplishing methods thereof will become apparent from the following detailed description of the exemplary embodiments, taken in conjunction with the accompanying drawings. However, the inventive concept is not limited to the exemplary embodiments described below and may be embodied in various forms.

It will be understood that although the terms "first", "second", etc. may be used herein to describe various components, these components should not be limited by these terms. These terms are only used to distinguish one component from another.

As used herein, the singular forms "a", "an", and "the" are intended to include the plural forms as well, unless the context clearly indicates otherwise.

It will be understood that the terms "comprise", "include", and/or "have" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of description. In other words, since sizes and thicknesses of components in the drawings are arbitrarily illustrated for convenience of description, the exemplary embodiments are not limited thereto.

Figure 2:
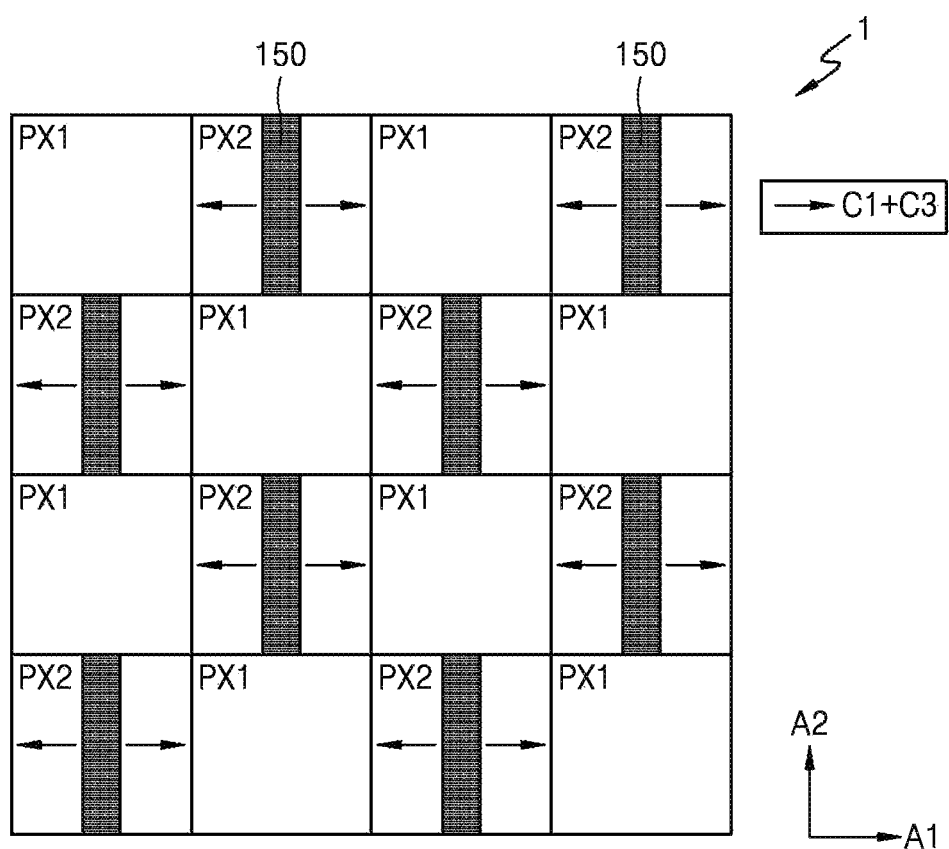
FIG. 2 is a plan view illustrating a relative disposition relationship between color separation elements and pixel regions in the image sensor of FIG. 1.

FIG. 1 is a cross-sectional view illustrating a schematic configuration of an image sensor 1 according to an exemplary embodiment. FIG. 2 is a plan view illustrating a relative disposition relationship between color separation elements and pixel regions in the image sensor 1 of FIG. 1.

The image sensor 1 includes a sensor array unit 110 and a first color separation element 150. The sensor array unit 110 includes an array of pixel regions, which include light sensing layers configured to sense lights. The first color separation element 150 is configured to separate an incident light L according to colors thereof and provide a result thereof to the sensor array unit 110.

The sensor array unit 110 includes a first pixel region PX1 and a second pixel region PX2 that are repeatedly arranged in a two-dimensional manner (or in rows and columns). As illustrated in FIG. 2, the first pixel region PX1 and the second pixel region PX2 may be repeatedly arranged along a first axis A1 and repeatedly arranged along a second axis A2. The first pixel region PX1 includes a stack of a first light sensing layer 112 and a third light sensing layer 116, and the second pixel region PX2 includes a second light sensing layer 114. The first to third light sensing layers 112, 114, and 116 are elements configured to sense lights and generate an electrical signal based on a result of sensing, and configured to sense a first primary color light C1, a second primary color light C2, and a third primary color light C3, respectively.

The first primary color light C1, the second primary color light C2, and the third primary color light C3 may be respectively a blue light, a green light, and a red light, for example. The following description will be made based on an assumption that the first primary color light C1, the second primary color light C2, and the third primary color light C3 are respectively a blue light, a green light, and a red light. However, the exemplary embodiments are not limited thereto.

The first to third light sensing layers 112, 114, and 116 may include a photodiode including a semiconductor material. For example, a silicon-based photodiode may be used in the first to third light sensing layers 112, 114, and 116 and a doping concentration may be properly determined based on a desired bandgap energy.

In the first pixel region PX1, a layer having a higher bandgap energy among the first and third light sensing layers 112 and 116 is disposed at an upper portion of the first pixel region PX1, that is, at a position closer to the first color separation element 150. For example, the first light sensing layer 112 may be set to have a bandgap energy to generate an electrical signal based on an energy corresponding to the blue light or more, and the third light sensing layer 116 may be set to have a bandgap energy to generate an electrical signal based on an energy corresponding to the red light or more. In this case, when lights of various wavelength bands are incident to the first pixel region PX1 to pass through the first light sensing layer 112 and sequentially pass through the third light sensing layer 116, the blue light may be sensed by the first light sensing layer 112 and the red light may be sensed by the third light sensing layer 116.

The first color separation element 150 is disposed facing a light incident surface of the sensor array unit 110 and configured to separate the incident light according to the wavelength thereof such that lights of different wavelengths may be incident on different pixel regions.

The color separation element 150 may be buried in a transparent dielectric layer 130 formed on the sensor array unit 110. The first color separation element 150 may separate colors of an incident light by changing the traveling path of the incident light according to the wavelength of the incident light, by using the diffraction or refraction property of the light that varies according to the wavelength thereof. The first color separation element 150 may have a structure that has a width similar to the wavelength of the incident light and includes a material having a larger refractive index than a peripheral material. In this structure, the optical boundary between materials is not clearly defined, and a first region, in which a refractive index changes according to a refractive index difference between the peripheral material and the first color separation element 150 and the size of the first color separation element 150, is positioned around the first color separation element 150.

For example, a distribution of a refractive index distribution in the first region has an effect similar to that of a graded index lens, and the path of the incident light changes based on the distribution of the refractive index. Since the first region in which the refractive index distribution is formed varies according to a wavelength of the incident light, when the incident light includes lights of various wavelengths, the path of each light included in the incident light and having passed through the first color separation element 150 may vary according to the wavelength thereof. Thus, a desired color separation function may be implemented by controlling the refractive index of the transparent dielectric layer 130 and the refractive index and the size of the first color separation element 150.

The first color separation element 150 may include a material having a higher refractive index than a refractive index of the transparent dielectric layer 130 that is adjacent to the first color separation element 150. For example, the transparent dielectric layer 130 may include $SiO_2$ or siloxane-based spin on glass (SOG), and the first color separation element 150 may include a high-refractive-index material such as $TiO_2$, $SiN_3$, ZnS, ZnSe, or $Si_3N_4$. The size and shape of the first color separation element 150 may be variously determined according to a desired spectrum distribution of a light that has passed through the first color separation element 150.

A microlens array 190 may be further provided on the transparent dielectric layer 130 to focus the incident light L on the first color separation element 150.

In an exemplary embodiment, the first color separation element 150 separates the incident light L into a mixed light C1+C3, based on the first primary color light C1 and the third primary color light C3, and the second primary color light C2. The first color separation element 150 is disposed to face the second pixel region PX2, to allow the second primary color light C2 to pass through the first color separation element 150 and travel in a first direction toward the second pixel region PX2 and allow the mixed light C1+C3 of the first primary color light C1 and the third primary color light C3 to pass through the first color separation element 150 and travel in a second direction slanted with respect to the first direction.

For example, the mixed light C1+C3 of the first primary color light C1 and the third primary color light C3 may pass through the first color separation element 150 and travel in two directions with respect to the divergence direction of the second primary color light C2 therebetween. The mixed light C1+C3 of the first primary color light C1 and the third primary color light C3 may be diverged in two directions substantially symmetrical with respect to the divergence direction of the second primary color light C2, and may be diverged, for example, in the directions toward the two first pixel regions PX1 disposed on both sides of the second pixel region PX2.

As illustrated in FIGS. 1 and 2, the cross section of the first color separation element 150, which faces the sensor array unit 110, may have a rectangular shape, and the first color separation element 150 may be disposed such that a longitudinal side of the first color separation element 150 extends parallel to the second axis A2. However, the exemplary embodiments are not limited thereto.

For example, when the first primary color light C1, the second primary color light C2, and the third primary color light C3 are respectively a blue light, a green light, and a red light, the mixed light C1+C3 (e.g., magenta light) of the first primary color light C1 and the third primary color light C3 is incident on the first pixel region PX1. Also, the green light is incident on the second pixel region PX2. In FIG. 2, arrows represent the divergence directions of the magenta light and the green light diverged by the first color separation element 150. The magenta light is incident on the first pixel region PX1 that is adjacent to the second pixel region PX2 along the first axis A1. The green light is incident on the second pixel region PX2 that is located under (or directly under) the first color separation element 150.

When the magenta light incident on the first pixel region PX1 passes through the first light sensing layer 112, a component of a blue light of the magenta light is first absorbed. An electrical signal having intensity corresponding to intensity of the absorbed blue light is generated by the first light sensing layer 112. The red light is absorbed by the third light sensing layer 116, and an electrical signal having intensity corresponding to intensity of the absorbed red light is generated by the third light sensing layer 116.

Figure 3:
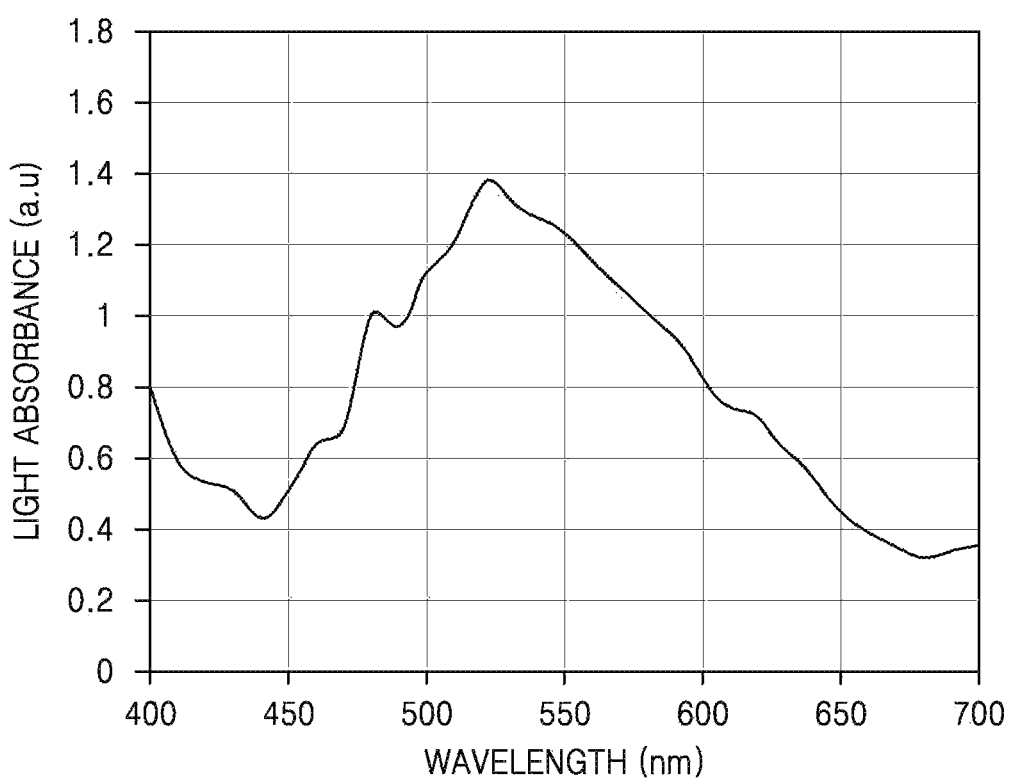
FIG. 3 illustrates a spectrum of a light absorbed by a second pixel region in the image sensor of FIG. 1.
Figure 4:
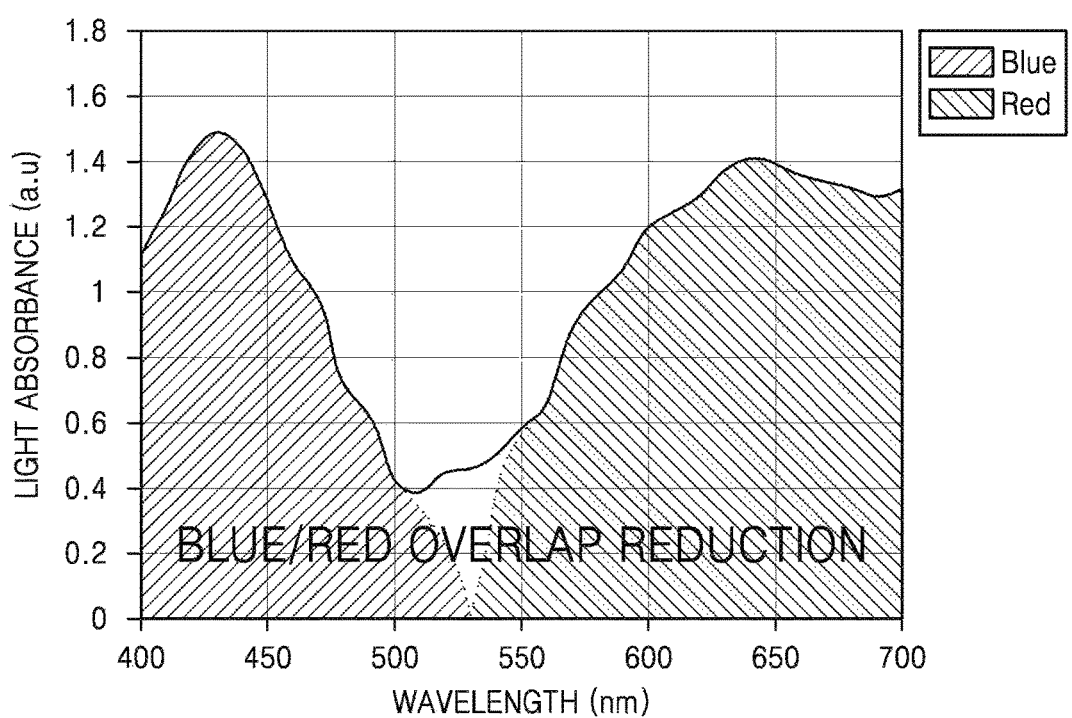
FIG. 4 illustrates a spectrum of a light absorbed by a first pixel region in the image sensor of FIG. 1.

FIG. 3 illustrates a spectrum of the light absorbed by the second pixel region PX2 in the image sensor 1 of FIG. 1. FIG. 4 illustrates a spectrum of the light absorbed by the first pixel region P1 in the image sensor 1 of FIG. 1.

As described above, after passing through the first color separation element 150, the green light is diverged in the direction toward the second pixel region PX2, and the mixed light of the red light and the blue light is diverged in the direction toward the first pixel region PX1.

Referring to FIG. 3, it may be seen that due to the color separation effect of the first color separation element 150, the spectrum of the light absorbed by the second pixel region PX2 mainly corresponds to the green wavelength band and additionally includes some of lights including the red and blue wavelength bands.

Referring to FIG. 4, due to the color separation effect, the spectrum of the light absorbed by the first pixel region PX1 mainly corresponds to the red and blue wavelength bands and includes some of lights including the green wavelength band. Since the first pixel region PX1 includes a stacked structure configured to sequentially sense the blue light and the red light, the "Blue" wavelength band is sensed by the first light sensing layer 112 and the "Red" wavelength band is sensed by the third light sensing layer 116. As illustrated in FIG. 4, since the overlap between the "Blue" and "Red" wavelength bands is substantially small, which is reflected in the red color purity and blue color purity sensed by the first pixel region PX1, an improved color purity of a sensed light may be implemented.

As described above, the image sensor 1 has a high light efficiency because image sensor 1 uses the color separation element 150 to diverge the light according to colors without using a color filter to extract color components of the incident light. Also, as illustrated in FIG. 4, when the mixed light including the blue wavelength band and the red wavelength band is incident on the first pixel region PX1, since a stacked light sensing structure is used to sequentially sense the blue and red lights having a large wavelength difference therebetween, the color purity of the light sensed by the first pixel region PX1 is improved.

Figure 5:
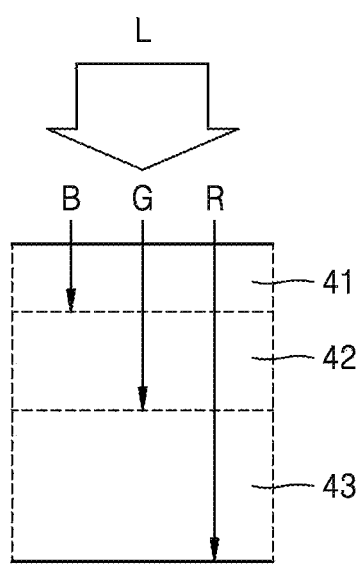
FIG. 5 is a cross-sectional view illustrating a schematic configuration of an image sensor according to a comparative example.
Figure 6:
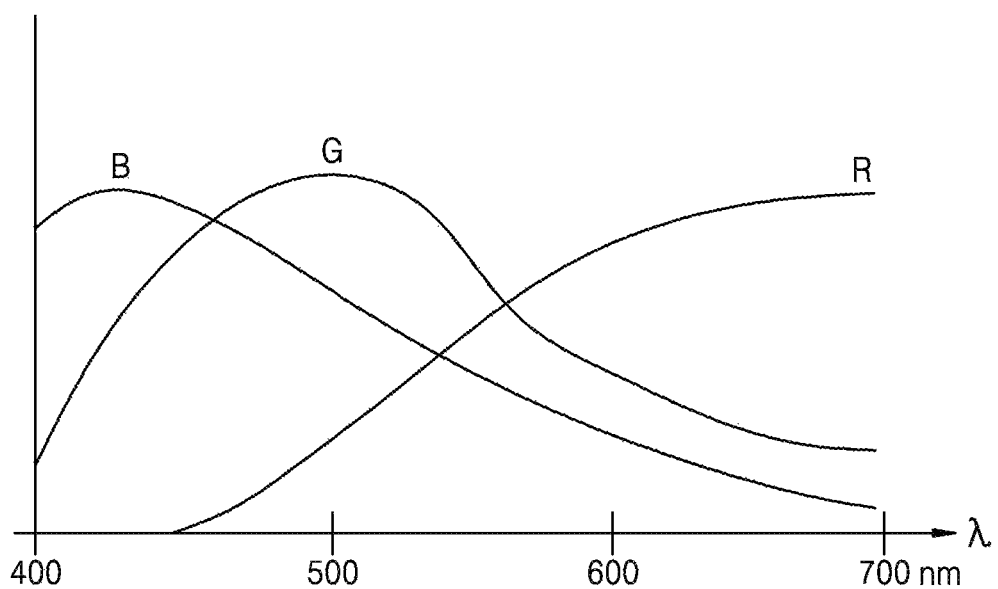
FIG. 6 illustrates spectrums of lights absorbed respectively by light sensing layers of the image sensor of FIG. 5.

FIG. 5 is a cross-sectional view illustrating a schematic configuration of an image sensor according to a comparative example. FIG. 6 illustrates spectrums of lights absorbed respectively by light sensing layers of the image sensor of FIG. 5.

The image sensor according to a comparative example has a stack of light sensing layers 41, 42, and 43 to sense blue, green, and red colors, respectively. Without using a color filter, the image sensor according to the comparative example may separate and sense the colors in the light sensing layers 41, 42, and 43. The light sensing layers 41, 42, and 43 respectively have energy bandgaps set to absorb the energy corresponding to the blue, green, and red lights and generate electrical signals, wherein there may be an overlap between the wavelength bands of the lights absorbed respectively by the light sensing layers 41, 42, and 43.

Referring to FIG. 6, a curve B represents the spectrum of the light absorbed by the light sensing layer 41, a curve G represents the spectrum of the light absorbed by the light sensing layer 42, and a curve R represents the spectrum of the light absorbed by the light sensing layer 43. As illustrated in FIG. 6, there is a considerable overlap between the wavelength bands of the lights absorbed respectively by the light sensing layers 41, 42, and 43, which causes a degradation in a color purity.

Unlike the comparative example, the image sensor 1 according to the exemplary embodiment may have an increased light efficiency and an improved color purity because the image sensor 1 uses a stacked structure of the light sensing layers only in some pixel regions, the stacked structure using a stack of the red light sensing layer and the blue light sensing layer to reduce an overlap between the wavelength bands of absorbed lights.

The structures of image sensors according to various exemplary embodiments will be described hereinafter.

Figure 7:
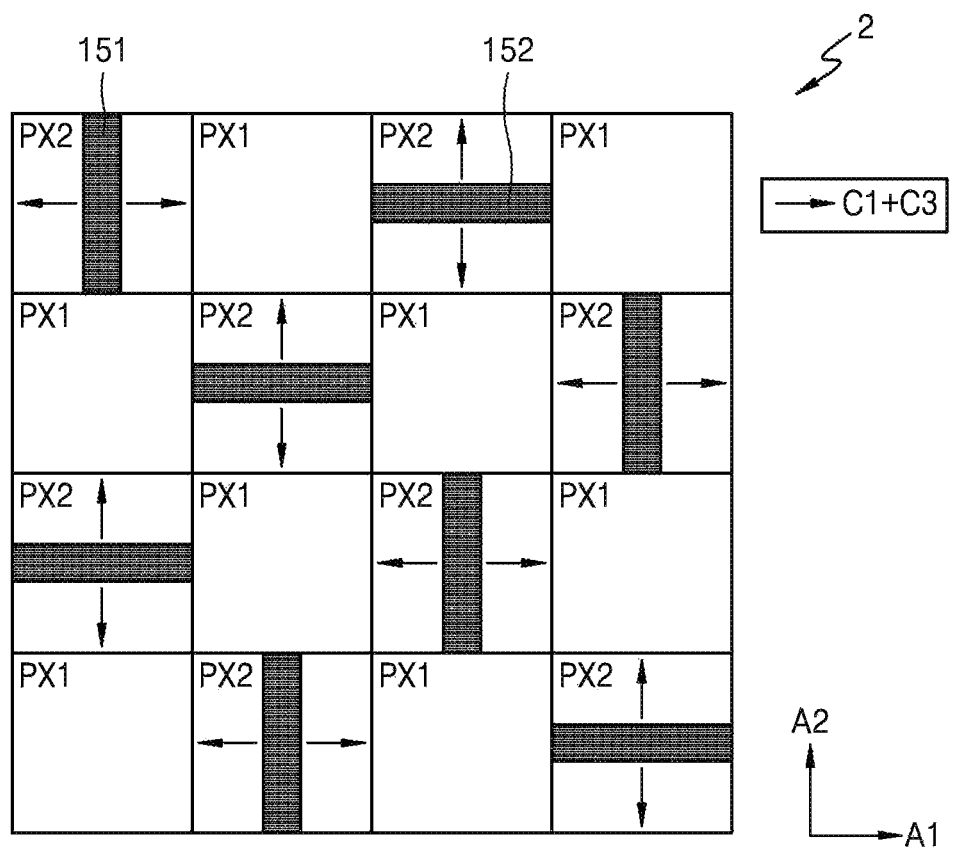
FIG. 7 is a plan view illustrating a schematic configuration of an image sensor according to another exemplary embodiment.

FIG. 7 is a plan view illustrating a schematic configuration of an image sensor 2 according to another exemplary embodiment.

The image sensor 2 of the exemplary embodiment of FIG. 7 is different from the image sensor 1 of FIG. 1 with respect to a disposition form of first color separation elements 151 and 152 that are disposed adjacent to each other. The cross sections of the first color separation elements 151 and 152 facing the sensor array unit 110 have a rectangular shape, and the respective longitudinal sides of the first color separation elements 151 and 152 are perpendicular to each other. For example, the longitudinal side of the first color separation element 151 is parallel to the second axis A2, and the longitudinal side of the first color separation element 152 is parallel to the first axis A1.

In FIG. 7, arrows represent the divergence directions of the mixed light C1+C3 of the first primary color light C1 and the third primary color light C3. For example, the first color separation elements 151 and 152 allow the second primary color light C2 to pass therethrough and proceed toward the second pixel region PX2 located under the first color separation elements 151 and 152 and allow the mixed light C1+C3 of the first primary color light C1 and the third primary color light C3 to pass therethrough and proceed toward the first pixel region PX1 adjacent to the second pixel region PX2. As an example, the first color separation element 151 allows the mixed light C1+C3 of the first primary color light C1 and the third primary color light C3 to pass therethrough and proceed toward the first pixel regions PX1 that are adjacent to the second pixel region PX2 in the horizontal direction, that is, in the direction along the first axis A1. Also, the first color separation element 152 allows the mixed light C1+C3 of the first primary color light C1 and the third primary color light C3 to pass therethrough and proceed toward the first pixel regions PX1 that are adjacent to the second pixel region PX2 in the vertical direction, that is, in the direction of the second axis A2. According to the above disposition of the first color separation elements 151 and 152, the mixed light C1+C3 of the first primary color light C1 and the third primary color light C3 is incident on the first pixel region PX1, and the second primary color light C2 is incident on the second pixel region PX2.

Figure 8:
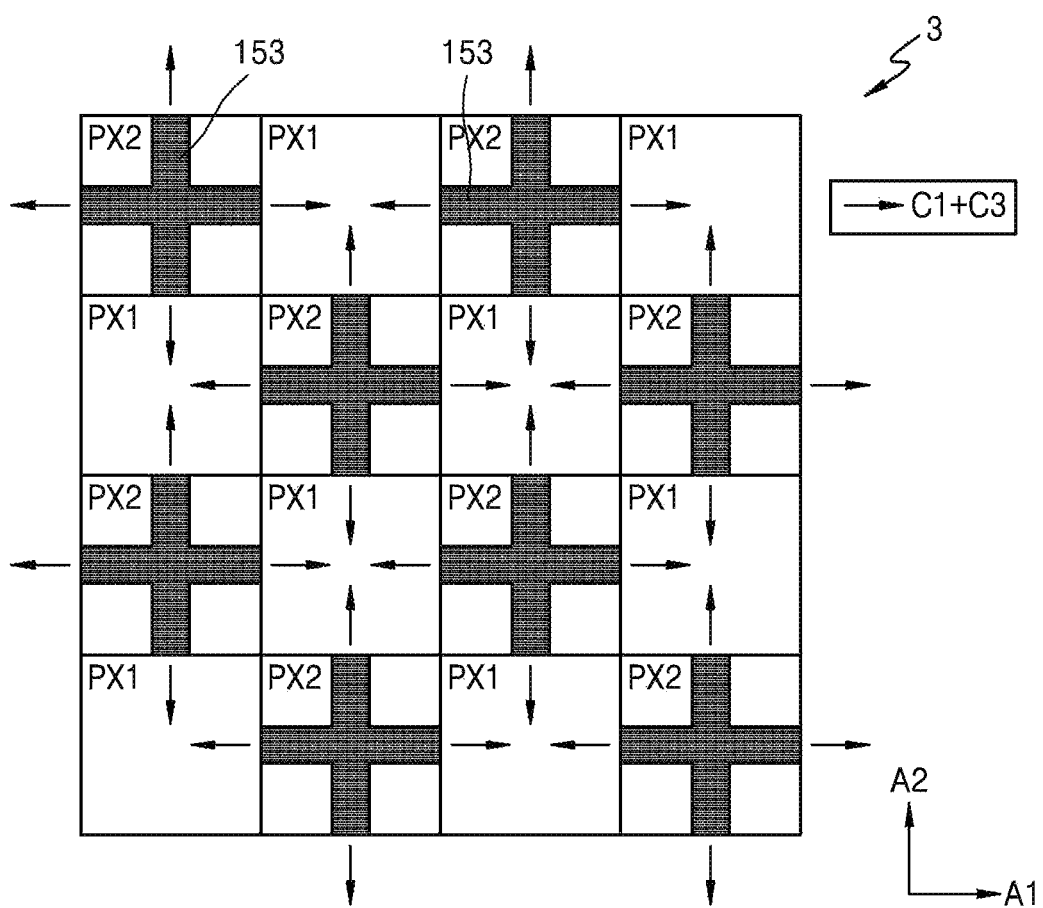
FIG. 8 is a plan view illustrating a schematic configuration of an image sensor according to still another exemplary embodiment.

FIG. 8 is a plan view illustrating a schematic configuration of an image sensor 3 according to still another exemplary embodiment.

The image sensor 3 of the exemplary embodiment of FIG. 8 is different from the image sensors of the above exemplary embodiments with respect to a cross-sectional shape of a first color separation element 153. In FIG. 8, the first color separation element 153 is disposed to face the second pixel region PX2, and the cross section thereof that is cut along a line parallel to the sensor array unit 110 has a cross shape. In other words, the cross section of the first color separation element 153 is formed on a plane, defined by the first axis A1 and the second axis A2, on which the pixel regions are arrayed.

The first color separation element 153 allows the mixed light C1+C3 of the first primary color light C1 and the third primary color light C3 to pass therethrough and proceed toward four first pixel regions PX1 that are adjacent to the corresponding second pixel region PX2 in the directions of the first axis A1 and the second axis A2.

Figure 9:
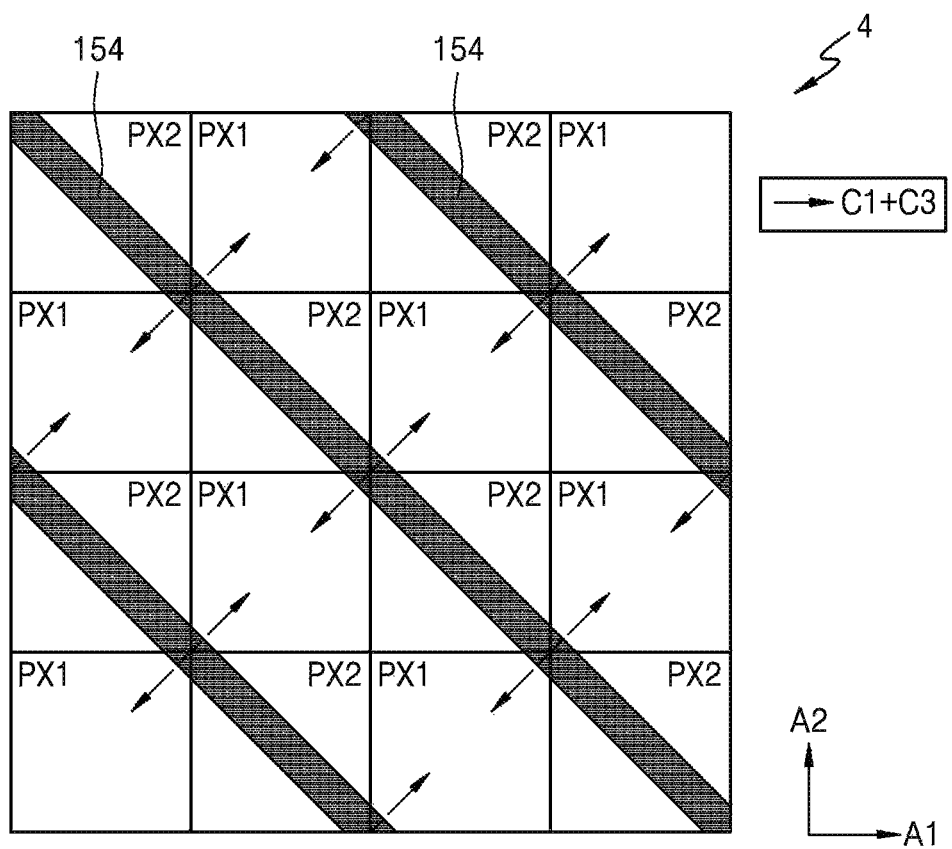
FIG. 9 is a plan view illustrating a schematic configuration of an image sensor according to still another exemplary embodiment.

FIG. 9 is a plan view illustrating a schematic configuration of an image sensor 4 according to another exemplary embodiment.

In the exemplary embodiment of FIG. 9, a first color separation element 154 is disposed to face the second pixel region PX2 and has a rectangular shape, when viewed in a plan view. A longitudinal side of the rectangular shape of the first color separation element 154 is parallel to the diagonal line of the second pixel region PX2. A plurality of first color separation elements 154 may be connected to each other (or the first color separation element 154 extends) in the direction parallel to the diagonal direction of the second pixel region PX2.

The first color separation element 154 allows the second primary color light C2 to pass therethrough and proceed toward the corresponding second pixel region PX2 and allows the mixed light C1+C3 of the first primary color light C1 and the third primary color light C3 to pass therethrough and proceed toward the four first pixel regions PX1 that are adjacent to the second pixel region PX2 in the horizontal direction and the vertical direction (or the direction along the first axis A1 and the direction along the second axis A2).

Figure 10:
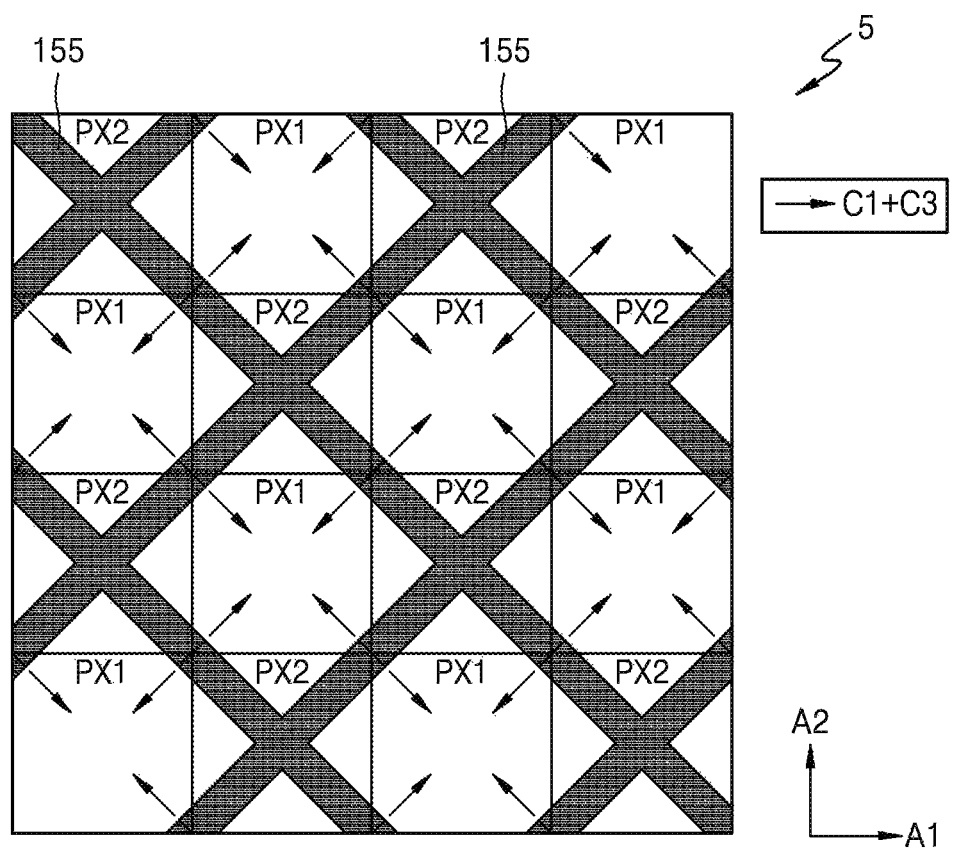
FIG. 10 is a plan view illustrating a schematic configuration of an image sensor according to still another exemplary embodiment.

FIG. 10 is a plan view illustrating a schematic configuration of an image sensor 5 according to still another exemplary embodiment.

In the exemplary embodiment of FIG. 10, a first color separation element 155 is disposed to face the second pixel region PX2, and has a shape of 'X', when viewed in a plan view. Lines forming the 'X' shape extend in directions that are parallel to two diagonal lines of the second pixel region PX2. Also, as illustrated in FIG. 10, a plurality of first color separation elements 155 may be connected to each other (or the first color separation element 155 extends) in the directions parallel to the two diagonal lines of the second pixel region PX2.

The first color separation element 155 allows the second primary color light C2 to pass therethrough and proceed toward the corresponding second pixel region PX2 and allows the mixed light C1+C3 of the first primary color light C1 and the third primary color light C3 to pass therethrough and proceed toward the four first pixel regions PX1 that are adjacent to the second pixel region PX2 in the horizontal direction and the vertical direction.

Figure 11:
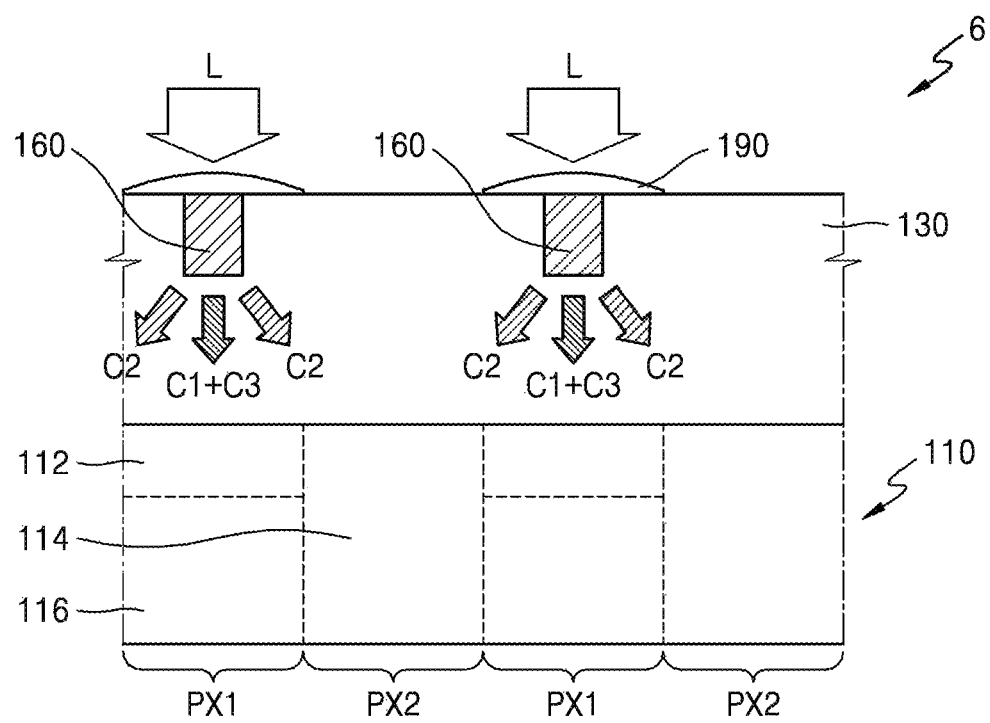
FIG. 11 is a cross-sectional view illustrating a schematic configuration of an image sensor still according to another exemplary embodiment.
Figure 12:
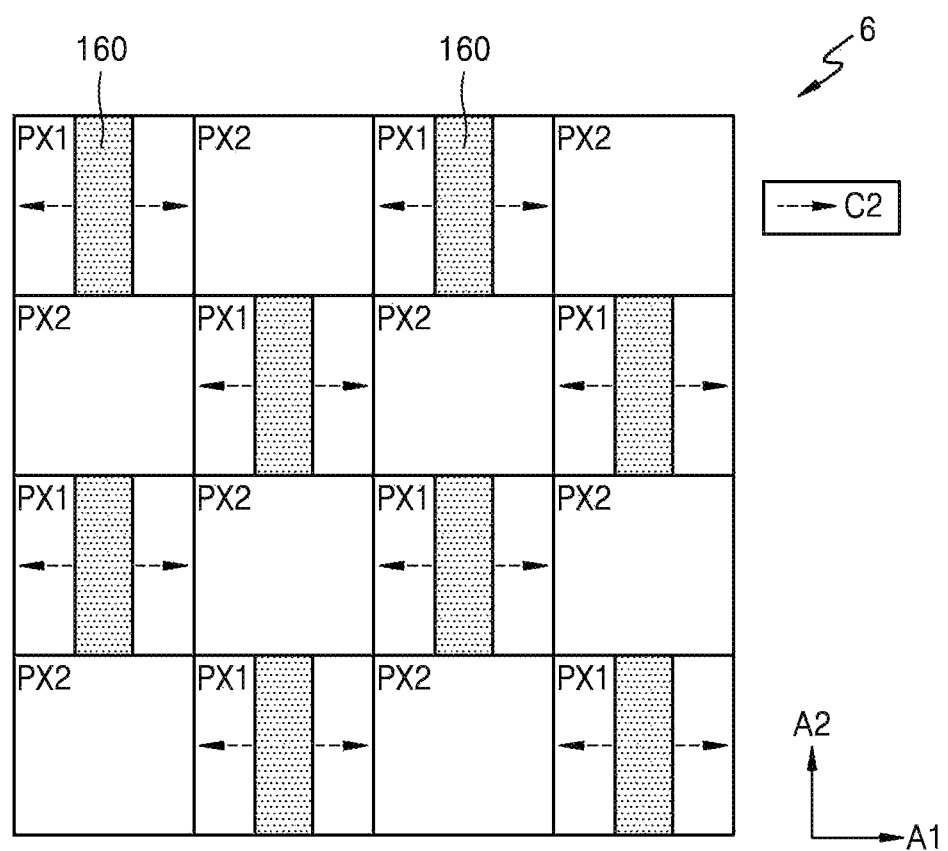
FIG. 12 is a plan view illustrating a relative disposition relationship between color separation elements and pixel regions in the image sensor of FIG. 11.

FIG. 11 is a cross-sectional view illustrating a schematic configuration of an image sensor 6 according to still another exemplary embodiment. FIG. 12 is a plan view illustrating a relative disposition relationship between color separation elements and pixel regions in the image sensor 6 of FIG. 11.

The image sensor 6 includes a sensor array unit 110 including an array of pixel regions, the pixel regions including light sensing layers configured to sense lights, and a second color separation element 160 configured to color-separate an incident light L and provide a result thereof to the sensor array unit 110.

The second color separation element 160 of the exemplary embodiment of FIG. 11 is different from those of the above exemplary embodiments with respect to the disposition position and the color separation operation of the second color separation element 160.

The second color separation element 160 is disposed to face the first pixel region PX1. The second color separation element 160 diverges the mixed light C1+C3 of the first primary color light C1 and the third primary color light C3 in a direction toward the first pixel region PX1 and diverges the second primary color light C2 in two directions substantially symmetrical with respect to the divergence direction of the mixed light C1+C3 (e.g., direction toward the first pixel region PX1). That is, the mixed light C1+C3 of the first primary color light C1 and the third primary color light C3 is diverged toward the two second pixel regions PX2 on both sides of the first pixel region PX1.

In the plan view of FIG. 12, dashed arrows represent the divergence directions of the second primary color light C2. According to the above color separation function of the second color separation element 160, the mixed light C1+C3 of the first primary color light C1 and the third primary color light C3 is incident on the first pixel region PX1, and the second primary color light C2 is incident on the second pixel region PX2.

The disposition of the second color separation element 160 having the color separation function as described above may be modified, for example but not limited to, into any of the dispositions illustrated in FIGS. 7 to 10.

Figure 13:
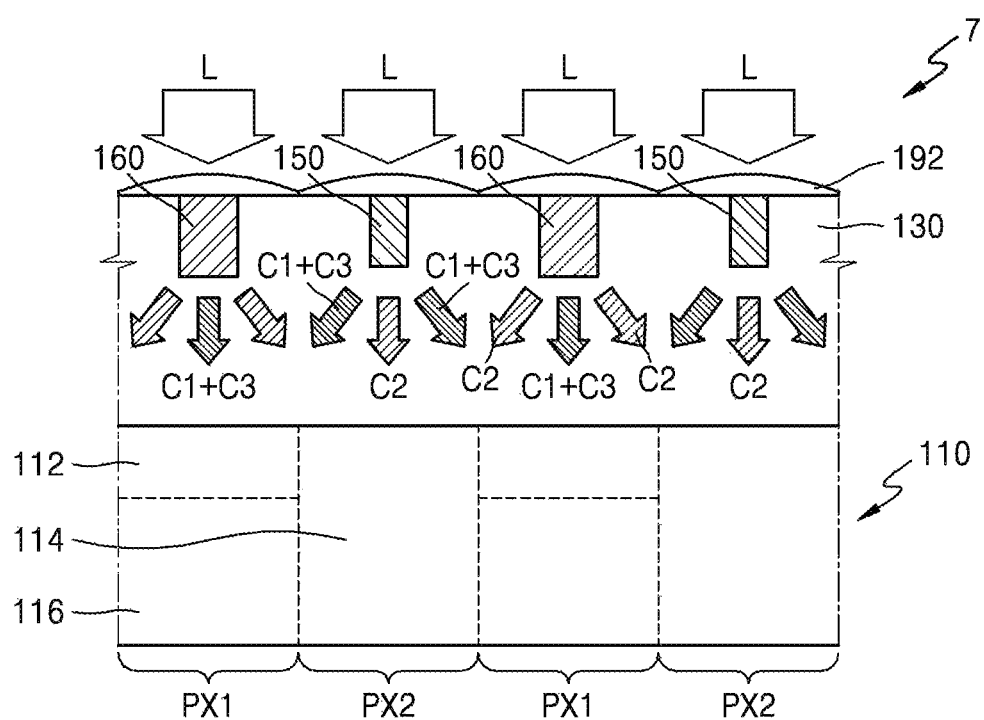
FIG. 13 is a cross-sectional view illustrating a schematic configuration of an image sensor according to still another exemplary embodiment.
Figure 14:
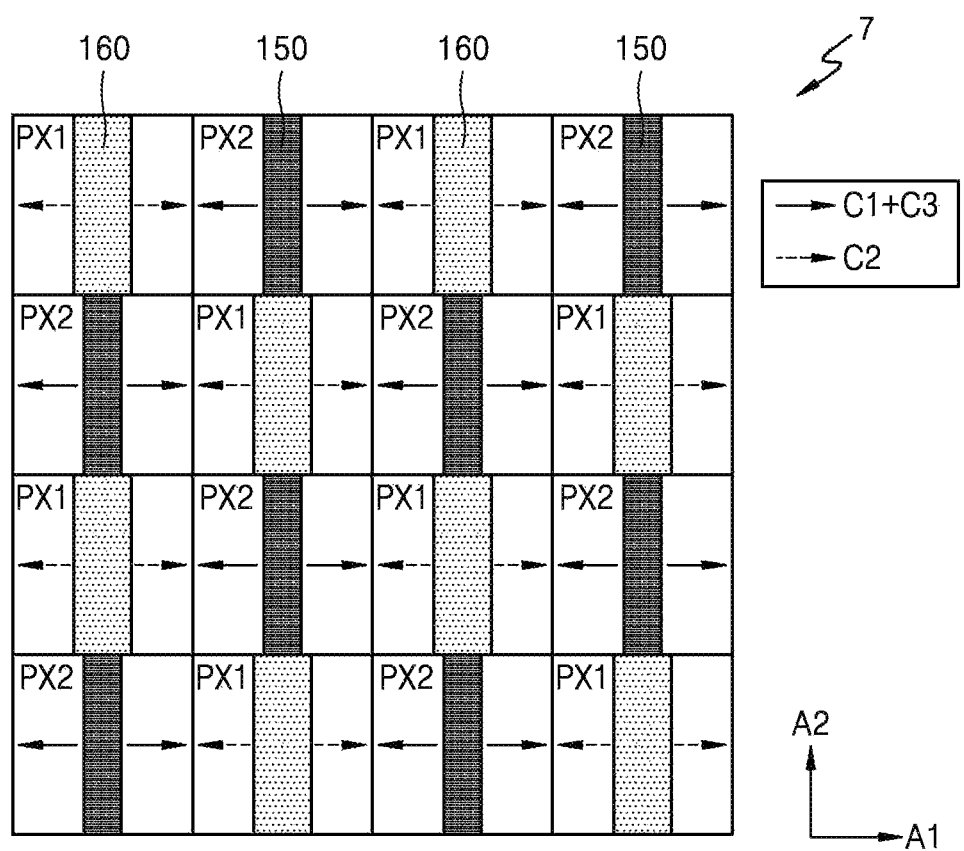
FIG. 14 is a plan view illustrating a relative disposition relationship between color separation elements and pixel regions in the image sensor of FIG. 13.

FIG. 13 is a cross-sectional view illustrating a schematic configuration of an image sensor 7 according to still another exemplary embodiment. FIG. 14 is a plan view illustrating a relative disposition relationship between color separation elements and pixel regions in the image sensor 7 of FIG. 13.

The image sensor 7 includes a sensor array unit 110 including an array of pixel regions, the pixel regions including light sensing layers configured to sense lights, and first and second color separation elements 150 and 160 configured to color-separate an incident light and provide a result thereof to the sensor array unit 110.

The image sensor 7 of the exemplary embodiment of FIG. 13 includes the first color separation element 150 and the second color separation element 160 that have different color separation functions.

The first color separation element 150 is disposed to face the second pixel region PX2, to diverge the second primary color light C2 to the corresponding second pixel region PX2 and diverge the mixed light C1+C3 of the first primary color light C1 and the third primary color light C3 to the first pixel regions PX1 adjacent to the second pixel region PX2.

The second color separation element 160 is disposed to face the first pixel region PX1, to diverge the mixed light C1+C3 of the first primary color light C1 and the third primary color light C3 to the corresponding first pixel region PX1 and diverge the second primary color light C2 to the second pixel regions PX2 adjacent to the first pixel region PX1.

As described above, the first and second color separation elements 150 and 160 may adjust the distribution form of light passing therethrough by using the refractive index and the shape of the first and second color separation elements 150 and 160 and may have different materials and/or different shapes. For example, the first and second color separation elements 150 and 160 may have the same material and different shapes or may have the same shape and different materials. The first and second color separation elements 150 and 160 may have different shapes and the same material, which improves convenience in a process of manufacturing the image sensor 7. As illustrated in FIG. 13, the second color separation element 160 may have a larger vertical length and a larger horizontal width than those of the first color separation element 150; however, this is merely exemplary, and the exemplary embodiments are not limited thereto.

The first and second color separation elements 150 and 160 may be buried in a transparent dielectric layer 130, and a microlens array 192 may be further provided on the transparent dielectric layer 130 to focus an incident light L on the first or second color separation element 150 or 160.

The cross sections of the first and second color separation elements 150 and 160 may have a rectangular shape, and the first and second color separation elements 150 and 160 may be disposed such that the longitudinal sides thereof are parallel to the second axis A2.

In FIG. 14, solid-line arrows represent the divergence directions of the mixed light C1+C3 of the first primary color light C1 and the third primary color light C3, and dashed arrows represent the divergence directions of the second primary color light C2.

As illustrated in FIGS. 13 and 14, the mixed light C1+C3 of the first primary color light C1 and the third primary color light C3 diverged by a given second color separation element 160 and the mixed light C1+C3 of the first primary color light C1 and the third primary color light C3 diverged by the first color separation element 150, which is adjacent to the given second color separation element 160, are incident on the first pixel region PX1. The second primary color light C2 diverged by a given first color separation element 150 and the second primary color light C2 diverged by the second color separation element 160, which is adjacent to the given first color separation element 150, are incident on the second pixel region PX2.

According to the exemplary embodiment, when at least two types of color separation elements are used, the efficiency of color separation of incident lights in the first pixel region PX1 and the second pixel region PX2 may be increased.

Figure 15:
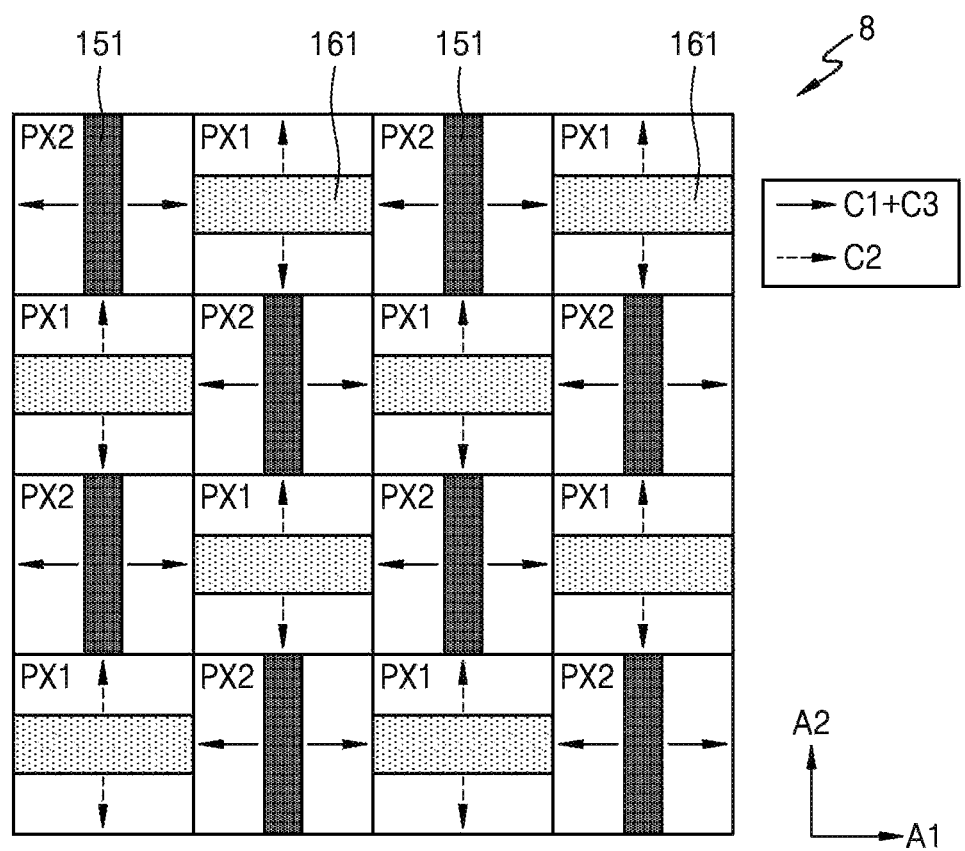
FIG. 15 is a plan view illustrating a schematic configuration of an image sensor according to still another exemplary embodiment.

FIG. 15 is a plan view illustrating a schematic configuration of an image sensor 8 according to still another exemplary embodiment.

The image sensor 8 of the exemplary embodiment of FIG. 15 is different from the image sensor 7 of FIG. 13 with respect to the disposition form of first and second color separation elements 151 and 161.

The first and second color separation elements 151 and 161 have a rectangular cross-sectional shape, the longitudinal side of the first color separation element 151 is parallel to the second axis A2, and the longitudinal side of the second color separation element 161 is parallel to the first axis A1. Thus, the first color separation element 151 diverges the second primary color light C2 toward the corresponding second pixel region PX2 (e.g., second pixel region PX2 below the first color separation element 151) and diverges the mixed light C1+C3 of the first primary color light C1 and the third primary color light C3 toward the two first pixel regions PX1 that are adjacent to the second pixel region PX2 in the horizontal direction. The second color separation element 161 diverges the second primary color light C2 toward the two second pixel regions PX2 that are adjacent to the first pixel region PX1 in the vertical direction.

Accordingly, the mixed light C1+C3 of the first primary color light C1 and the third primary color light C3 is incident on the first pixel region PX1, and the second primary color light C2 is incident on the second pixel region PX2.

Figure 16:
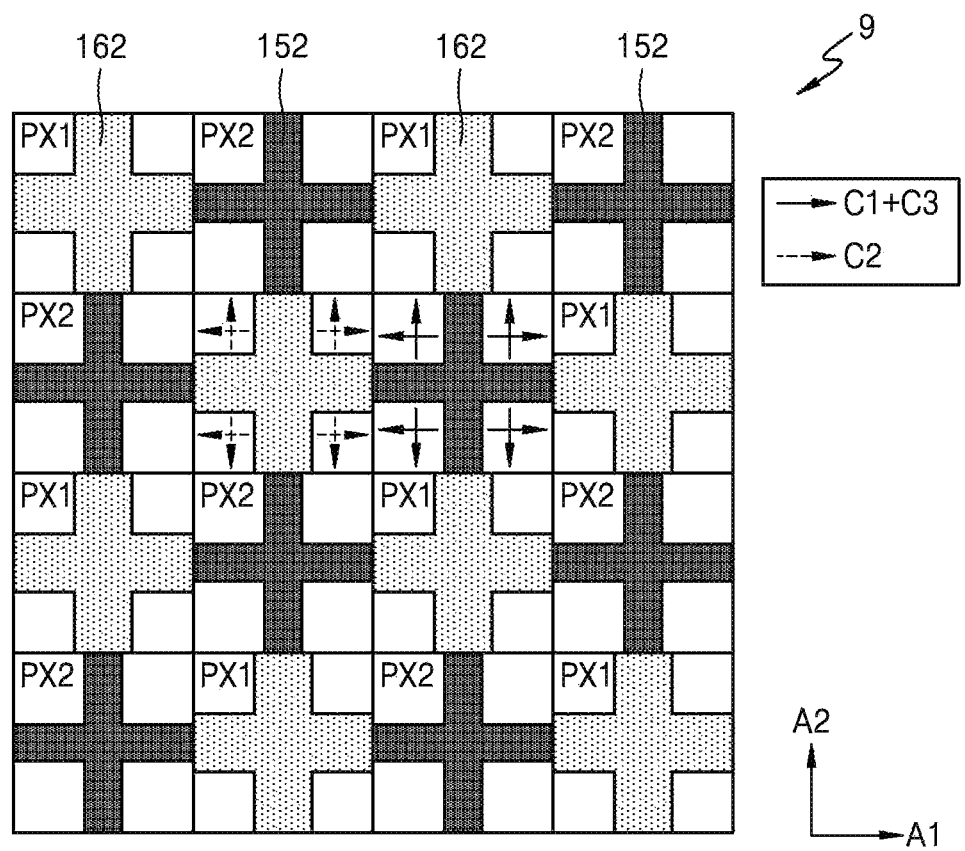
FIG. 16 is a plan view illustrating a schematic configuration of an image sensor according to still another exemplary embodiment.

FIG. 16 is a plan view illustrating a schematic configuration of an image sensor 9 according to still another exemplary embodiment.

The cross sections of first and second color separation elements 152 and 162 have a shape of a cross, and two lines forming the cross shape extend in directions that are parallel to the first axis A1 and the second axis A2.

The first color separation element 152 diverges the second primary color light C2 toward the corresponding second pixel region PX2 (or second pixel region PX2 below the first color separation element 152) and diverges the mixed light C1+C3 of the first primary color light C1 and the third primary color light C3 toward the four first pixel regions PX1 that are adjacent to the second pixel region PX2 in the horizontal and vertical directions. The second color separation element 162 diverges the mixed light C1+C3 of the first primary color light C1 and the third primary color light C3 toward the corresponding first pixel region PX1 (e.g., first pixel region PX1 below the second color separation element 162) and diverges the second primary color light C2 toward the four second pixel regions PX2 that are adjacent to the first pixel region PX1 in the horizontal and vertical directions.

Accordingly, the mixed light C1+C3 of the first primary color light C1 and the third primary color light C3 is incident on the first pixel region PX1, and the second primary color light C2 is incident on the second pixel region PX2.

Figure 17:
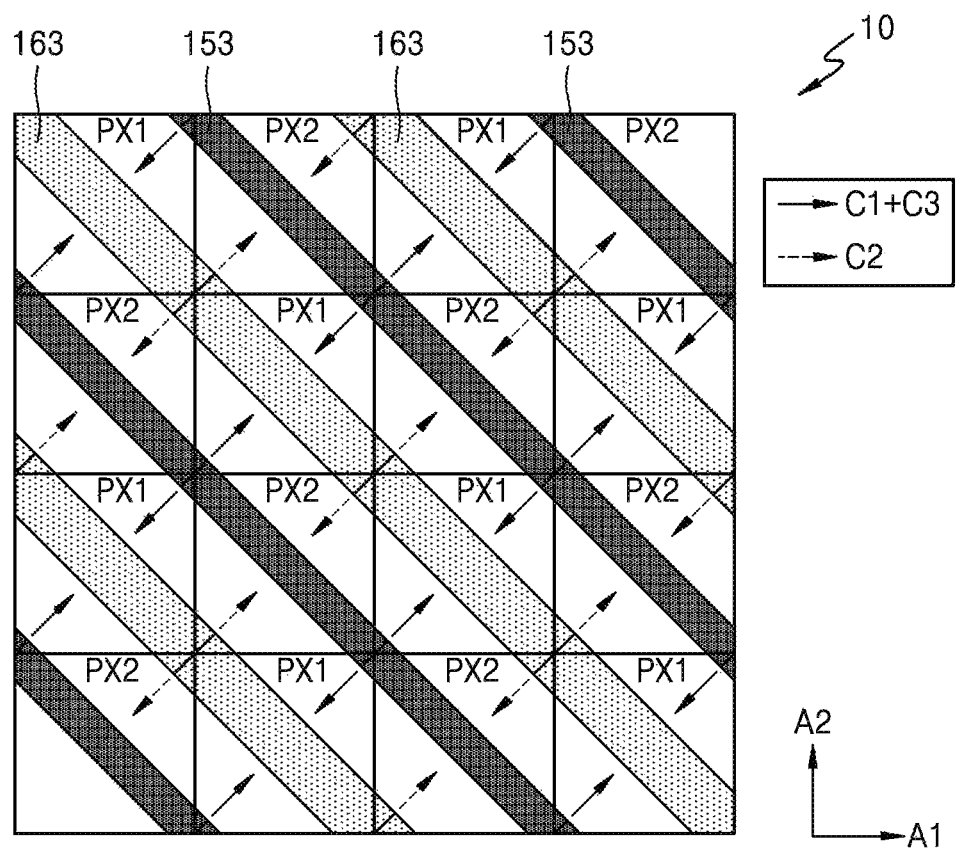
FIG. 17 is a plan view illustrating a schematic configuration of an image sensor according to still another exemplary embodiment.

FIG. 17 is a plan view illustrating a schematic configuration of an image sensor 10 according to still another exemplary embodiment.

A first color separation element 153 is disposed to face the second pixel region PX2, the cross section of the first color separation element 153 has a rectangular shape, and the longitudinal side of the rectangular shape is parallel to the diagonal line of the second pixel region PX2.

A second color separation element 163 is disposed to face the first pixel region PX1, the cross section of the second color separation element 163 has a rectangular shape, and the longitudinal side of the rectangular shape is parallel to the diagonal line of the first pixel region PX1.

As illustrated in FIG. 17, a plurality of first color separation elements 153 may be connected (or the first color separation element 153 extends) in the direction parallel to the diagonal line of the second pixel region PX2. Also, a plurality of second color separation elements 163 (or the second color separation element 163 extends) may be connected in the direction parallel to the diagonal line of the first pixel region PX1.

The first color separation element 153 diverges the second primary color light C2 toward the corresponding second pixel region PX2 and diverges the mixed light C1+C3 of the first primary color light C1 and the third primary color light C3 toward the four first pixel regions PX1 that are adjacent to the second pixel region PX2 in the horizontal and vertical directions. The second color separation element 163 diverges the mixed light C1+C3 of the first primary color light C1 and the third primary color light C3 toward the corresponding first pixel region PX1 and diverges the second primary color light C2 toward the four second pixel regions PX2 that are adjacent to the first pixel region PX1 in the horizontal and vertical directions.

Accordingly, the mixed light C1+C3 of the first primary color light C1 and the third primary color light C3 is incident on the first pixel region PX1, and the second primary color light C2 is incident on the second pixel region PX2.

Figure 18:
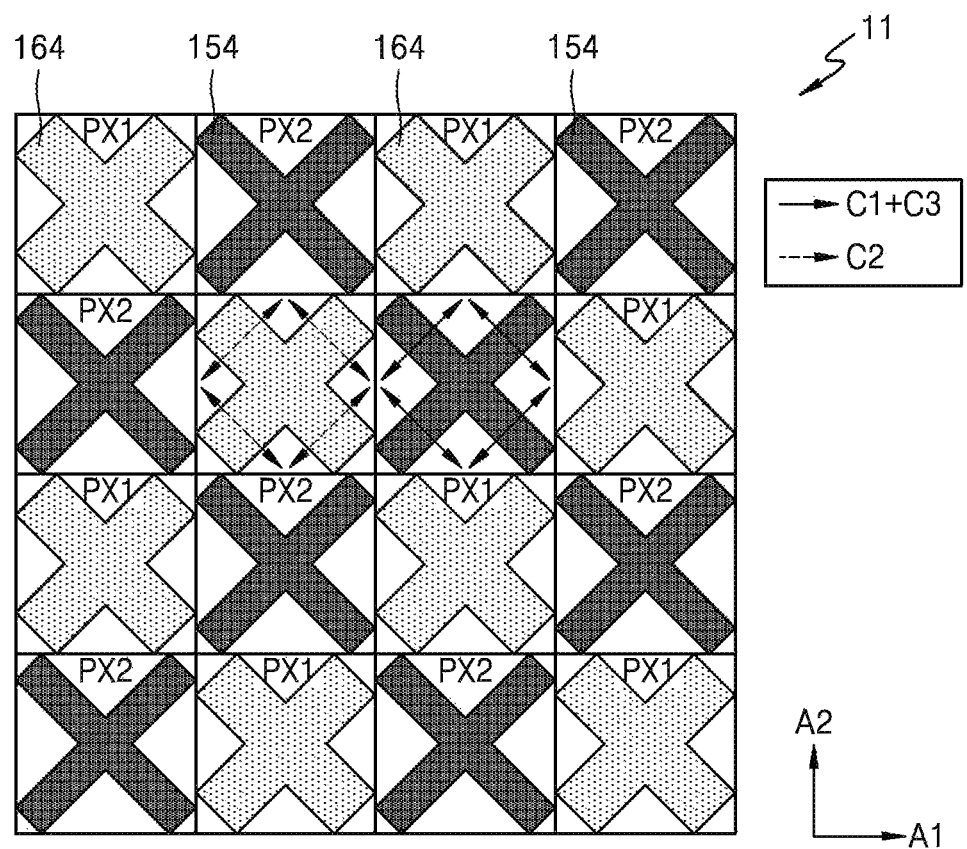
FIG. 18 is a plan view illustrating a schematic configuration of an image sensor according to still another exemplary embodiment.

FIG. 18 is a plan view illustrating a schematic configuration of an image sensor 11 according to still another exemplary embodiment.

First and second color separation elements 154 and 164 are disposed to face the second pixel region PX2 and the first pixel region PX1, respectively, the cross sections of the first and second color separation elements 154 and 164 have a cross shape, and two lines forming the cross shape are parallel to two diagonal lines of the pixel region.

The first color separation element 154 diverges the second primary color light C2 toward the corresponding second pixel region PX2 and diverges the mixed light C1+C3 of the first primary color light C1 and the third primary color light C3 toward the four first pixel regions PX1 that are adjacent to the second pixel region PX2 in the horizontal and vertical directions. The second color separation element 164 diverges the mixed light C1+C3 of the first primary color light C1 and the third primary color light C3 toward the corresponding first pixel region PX1 and diverges the second primary color light C2 toward the four second pixel regions PX2 that are adjacent to the first pixel region PX1 in the horizontal and vertical directions.

Accordingly, the mixed light C1+C3 of the first primary color light C1 and the third primary color light C3 is incident on the first pixel region PX1, and the second primary color light C2 is incident on the second pixel region PX2.

Figure 19:
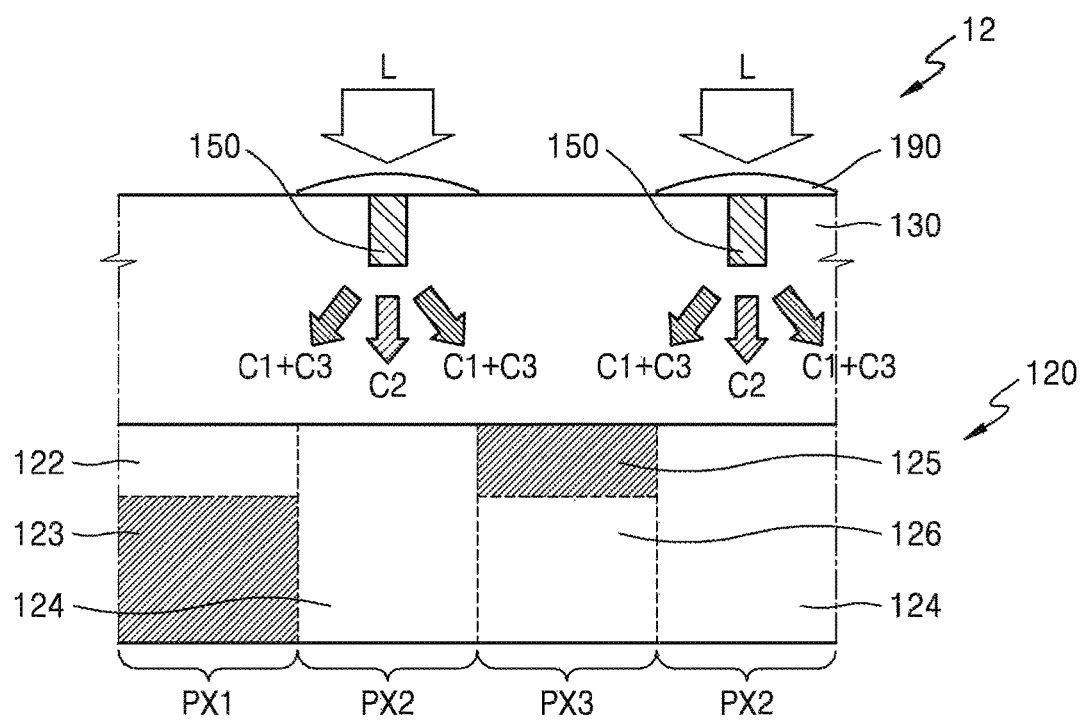
FIG. 19 is a cross-sectional view illustrating a schematic configuration of an image sensor according to still another exemplary embodiment.
Figure 20:
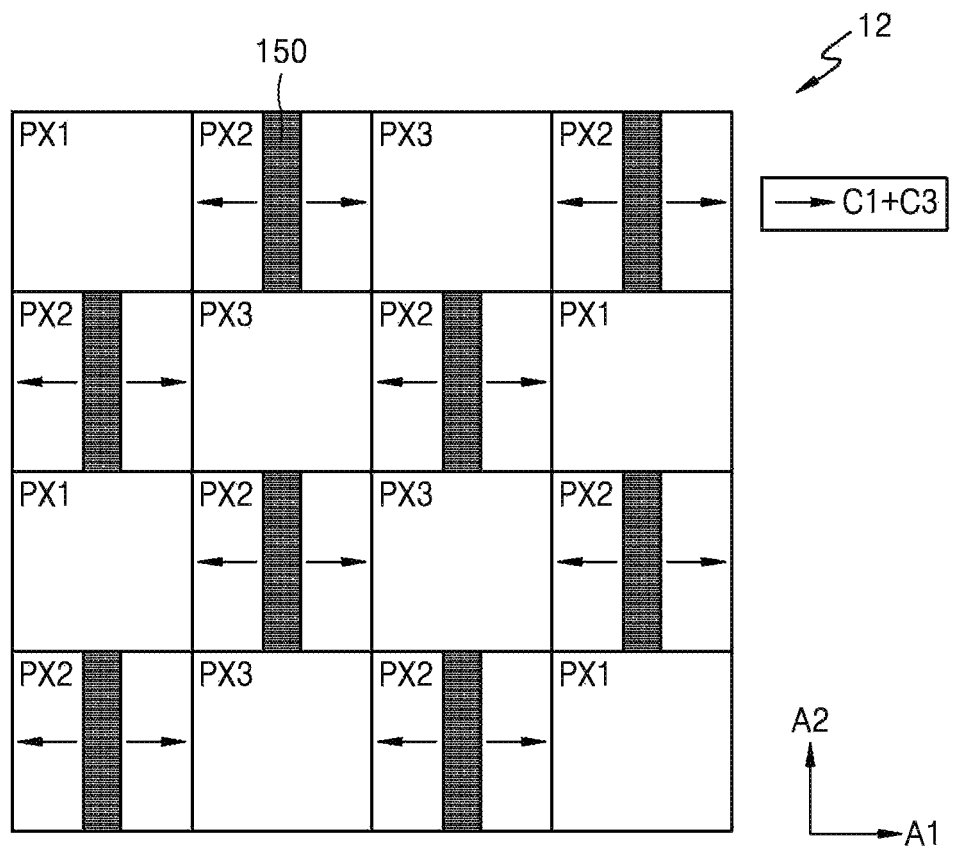
FIG. 20 is a plan view illustrating a relative disposition relationship between color separation elements and pixel regions in the image sensor of FIG. 19.

FIG. 19 is a cross-sectional view illustrating a schematic configuration of an image sensor 12 according to still another exemplary embodiment. FIG. 20 is a plan view illustrating a relative disposition relationship between color separation elements and pixel regions in the image sensor 12 of FIG. 19.

The image sensor 12 includes a sensor array unit 120 including an array of pixel regions, the pixel regions including light sensing layers configured to sense lights, and a first color separation element 150 configured to color-separate an incident light and provide a result thereof to the sensor array unit 120.

The image sensor 12 of the exemplary embodiment is different from those of the above exemplary embodiments with respect to the detailed configuration of the sensor array unit 120. The sensor array unit 120 includes first to third pixel regions PX1, PX2, and PX3.

As described in the above exemplary embodiments, the first color separation element 150 is disposed at the light incident side of the sensor array unit 120 to separate the incident light according to the wavelength thereof such that the lights of different wavelengths may be incident on different pixel regions. The first color separation element 150 is disposed to face the second pixel region PX2, to diverge the mixed light C1+C3 of the first primary color light C1 and the third primary color light C3 in two directions toward the first and third pixel regions PX1 and PX3 disposed on both sides of the second pixel region PX2 and diverge the second primary color light C2 toward the second pixel region PX2.

The sensor array unit 120 includes the first pixel region PX1, the second pixel region PX2, and the third pixel region PX3 that are repeatedly arranged in a two-dimensional manner (or in rows and columns). Referring to FIG. 20, the pixel regions are disposed in a first row in the order of the first pixel region PX1, the second pixel region PX2, the third pixel region PX3, and the second pixel region PX2. That is, the pixel regions are disposed to repeat a pattern of PX1-PX2-PX3-PX2 in the first row. The pixel regions are disposed in a second row in the order of the second pixel region PX2, the third pixel region PX3, the second pixel region PX2, and the first pixel region PX1. That is, the pixel regions are disposed to repeat a pattern of PX2-PX3-PX2-PX1 in the second row.

The first pixel region PX1 includes a first light sensing layer 122 configured to sense the first primary color light C1, the second pixel region PX2 includes a second light sensing layer 124 configured to sense the second primary color light C2, and the third pixel region PX3 includes a third light sensing layer 126 configured to sense the third primary color light C3. The first light sensing layer 122 and the third light sensing layer 126 are disposed at different depths (or different distances) from the first color separation element 150. For example, the first light sensing layer 122 and a light absorbing layer 123 are sequentially disposed in the first pixel region PX1 along a traveling direction of the incident light L, and a light absorbing layer 125 and the third light sensing layer 126 are sequentially disposed in the third pixel region PX3 along the traveling direction of the incident light L.

The first to third light sensing layers 122, 124, and 126 are elements configured to sense lights and generate electrical signals based on a result of sensing, and are configured to sense the first primary color light C1, the second primary color light C2, and the third primary color light C3 respectively. The first primary color light C1, the second primary color light C2, and the third primary color light C3 may be respectively a blue light, a green light, and a red light. The first to third light sensing layers 122, 124, and 126 may include photodiodes including semiconductor materials. For example, a silicon-based photodiode may be used in the first to third light sensing layers 122, 124, and 126 and, a doping concentration may be properly determined based on a desired bandgap energy. A layer having the higher bandgap energy (or sensing the shorter-wavelength light) among the first and third light sensing layers 122 and 126 of the first and third pixel regions PX1 and PX3 is disposed closer to the first color separation element 150.

The light absorbing layers 123 and 125 may include semiconductor materials. The light absorbing layers 123 and 125 absorb incident lights and do not generate any electrical signals, and may be, for example, a silicon layer with no P-N junction formed therein. In general, when lights are absorbed by the semiconductor materials, the shorter-wavelength light is absorbed first than the longer-wavelength light is absorbed. Thus, the first light sensing layer 122 configured to sense the first primary color light C1 corresponding to the blue light is disposed on the light absorbing layer 123 so that, when the mixed light C1+C3 of the first primary color light C1 and the third primary color light C3 separated by the first color separation element 150 is incident on the first pixel region PX1, the first primary light C1 included in the mixed light C1+C3 is sensed by the first light sensing layer 122. Also, the second light sensing layer 126 configured to sense the third primary color light C1 corresponding to the red light is disposed under the light absorbing layer 125 so that, after the first primary color light C1 of the shorter wavelength band among the mixed light C1+C3 incident on the third pixel region PX3 is absorbed by the light absorbing layer 125, the third primary color light C3 is sensed by the third light sensing layer 126.

According to this structure, the sensor array unit 120 senses the blue light in the first pixel region PX1, senses the green light in the second pixel region PX2, and senses the red light in the third pixel region PX3. The color disposition of the light sensed by the sensor array unit 120 has the same pattern as the color disposition of a Bayer color filter that is generally used in an image sensor. For example, the sensor array unit 120 may sense lights having a pattern of repeating a basic unit of blue, green, red, and green colors in the color disposition of the first to fourth quadrants of the Bayer color filter. Thus, a color processing method in the existing image sensor may be used to implement the image sensor according to exemplary embodiments without substantial modification.

Although FIG. 20 illustrates that the cross section of the first color separation element 150 has a rectangular shape having a longitudinal side parallel to the second axis A2, the various modifications illustrated in FIGS. 7 to 10 may also be applied. For example, the cross section of the first color separation element 150 may have a rectangular shape having a longitudinal side parallel to the first axis A1, or a plurality of the first color separation elements 150 are arranged so that the longitudinal sides of the rectangular shapes of the adjacent first color separation elements 150 may be respectively parallel to the first axis A1 and the second axis A2 in an alternating manner. As another example, the longitudinal side of the rectangular shape of the cross section of the first color separation element 150 may be parallel to the diagonal line of the second pixel region PX2, and the cross section thereof may have a cross shape.

Figure 21:
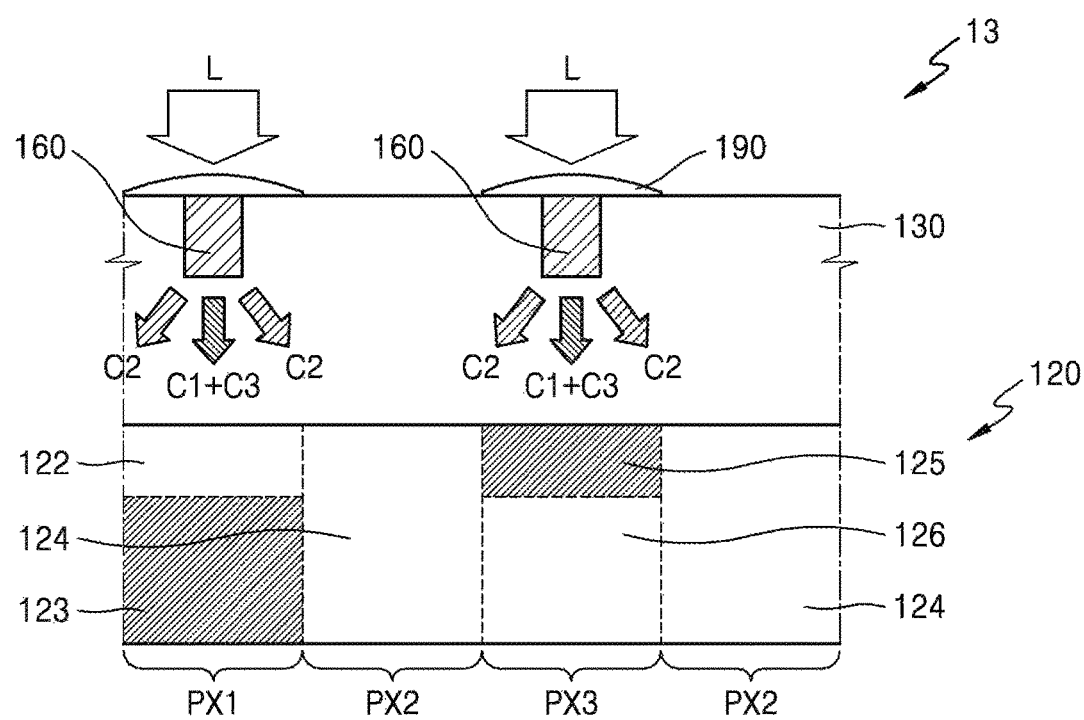
FIG. 21 is a cross-sectional view illustrating a schematic configuration of an image sensor according to still another exemplary embodiment.

FIG. 21 is a cross-sectional view illustrating a schematic configuration of an image sensor 13 according to still another exemplary embodiment.

The image sensor 13 includes a sensor array unit 120 including an array of pixel regions, the pixel regions including light sensing layers configured to sense lights, and a second color separation element 160 configured to separate an incident light according to colors thereof and provide a result thereof to the sensor array unit 120.

The sensor array unit 120 includes the first pixel region PX1, the second pixel region PX2, and the third pixel region PX3 that are repeatedly and alternatingly arranged in a two-dimensional manner. The first pixel region PX1 includes a first light sensing layer 122 configured to sense the first primary color light C1, the second pixel region PX2 includes a second light sensing layer 124 configured to sense the second primary color light C2, and the third pixel region PX3 includes a third light sensing layer 126 configured to sense the third primary color light C3. The first light sensing layer 122 and the third light sensing layer 126 are respectively disposed at different depths (or different distances) from the second color separation element 160. Also, the light absorbing layer 123 and the light absorbing layer 125 are disposed in the first pixel region PX1 and the third pixel region PX3, respectively.

The second color separation element 160 may be disposed to face the first pixel region PX1. In this case, the second color separation element 160 diverges the mixed light C1+C3 of the first primary color light C1 and the third primary color light C3 in a direction toward the first pixel region PX1 and diverges the second primary color light C2 in two directions symmetrical with respect to the divergence direction of the first primary color light C1, that is, toward the second pixel regions PX2 on both sides of the first pixel region PX1.

The second color separation element 160 may be disposed to face the third pixel region PX3. In this case, the second color separation element 160 diverges the mixed light C1+C3 of the first primary color light C1 and the third primary color light C3 in a direction toward the third pixel region PX3 and diverges the second primary color light C2 in two directions symmetrical with respect to the divergence direction of the second primary color light C2, that is, toward the second pixel regions PX2 on both sides of the third pixel region PX3.

The disposition of the second color separation element 160 having the color separation function may also be modified, for example but not limited to, into any of the dispositions illustrated in FIGS. 7 to 10.

Figure 22:
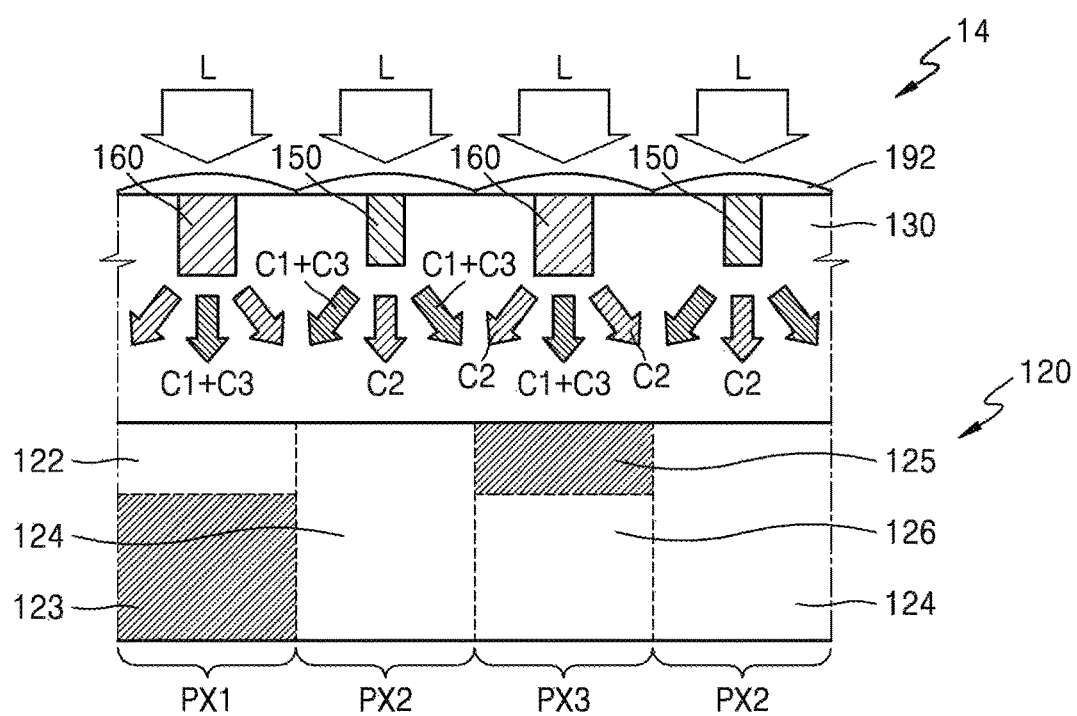
FIG. 22 is a cross-sectional view illustrating a schematic configuration of an image sensor according to still another exemplary embodiment.

FIG. 22 is a cross-sectional view illustrating a schematic configuration of an image sensor 14 according to still another exemplary embodiment.

The image sensor 14 includes a sensor array unit 120 including an array of pixel regions, the pixel regions including light sensing layers configured to sense lights, and first and second color separation elements 150 and 160 configured to color-separate an incident light L and provide a result thereof to the sensor array unit 120.

The image sensor 14 of the exemplary embodiment of FIG. 22 includes the first color separation element 150 and the second color separation element 160 that have different color separation functions.

The first color separation element 150 is disposed to face the second pixel region PX2, to diverge the second primary color light C2 toward the corresponding second pixel region PX2 and diverge the mixed light C1+C3 of the first primary color light C1 and the third primary color light C3 toward the first pixel regions PX1 adjacent to the second pixel region PX2.

The second color separation element 160 is disposed to face the first pixel region PX1, to diverge the mixed light C1+C3 of the first primary color light C1 and the third primary color light C3 toward the corresponding first pixel region PX1 and diverge the second primary color light C2 toward the second pixel regions PX2 adjacent to the first pixel region PX1.

As described above, the first and second color separation elements 150 and 160 may adjust the distribution form of the light passing therethrough based on the refractive index and the shape of the structure thereof.

As illustrated in FIG. 22, the second color separation element 160 may have a larger vertical length and a larger horizontal width than the first color separation element 150; however, this is merely exemplary, and the exemplary embodiments are not limited thereto.

The first and second color separation elements 150 and 160 may be buried in a transparent dielectric layer 130, and a microlens array 192 may be further provided on the transparent dielectric layer 130 to focus an incident light L on the first or second color separation element 150 or 160.

At least a portion of the mixed light C1+C3 of the first primary color light C1 and the third primary color light C3 diverged by the corresponding second color separation element 160 and at least a portion of the mixed light C1+C3 of the first primary color light C1 and the third primary color light C3 diverged by the adjacent first color separation elements 150 are incident on the first pixel region PX1. The second primary color light C2 diverged by the corresponding first color separation elements 150 and the second primary color light C2 diverged by the adjacent second color separation elements 160 are incident on the second pixel region PX2. At least another portion of the mixed light C1+C3 of the first primary color light C1 and the third primary color light C3 diverged by the corresponding second color separation element 160 and at least another portion of the mixed light C1+C3 of the first primary color light C1 and the third primary color light C3 diverged by the adjacent first color separation elements 150 are incident on the third pixel region PX3.

Among the mixed light C1+C3 of the first primary color light C1 and the third primary color light C3 incident on the first pixel region PX1 and the third pixel region PX3, the first primary color light C1 is sensed by the first light sensing layer 122 of the first pixel region PX1, and the third primary color light C3 is sensed by the third light sensing layer 126 of the third pixel region PX3.

According to the exemplary embodiment of FIG. 22, when at least two types of color separation elements are used, the efficiency of color separation of incident lights on the first pixel region PX1, the second pixel region PX2, and the third pixel region PX3 may be increased.

The shapes of the first and second color separation elements 150 and 160 may be modified, for example but not limited to, into any of the forms illustrated in FIGS. 15 to 18.

As described above, according to the various exemplary embodiments, since the color separation element of an image sensor separates the incident light according to the colors thereof and the pixel region configured to sense the incident light includes both the horizontal structure and/or the stacked structure of the light sensing layers, the light efficiency and the color purity of the image sensor may be improved. The described embodiments of the image sensor are merely exemplary, and various modifications and/or combinations thereof may be possible.

Figure 23:
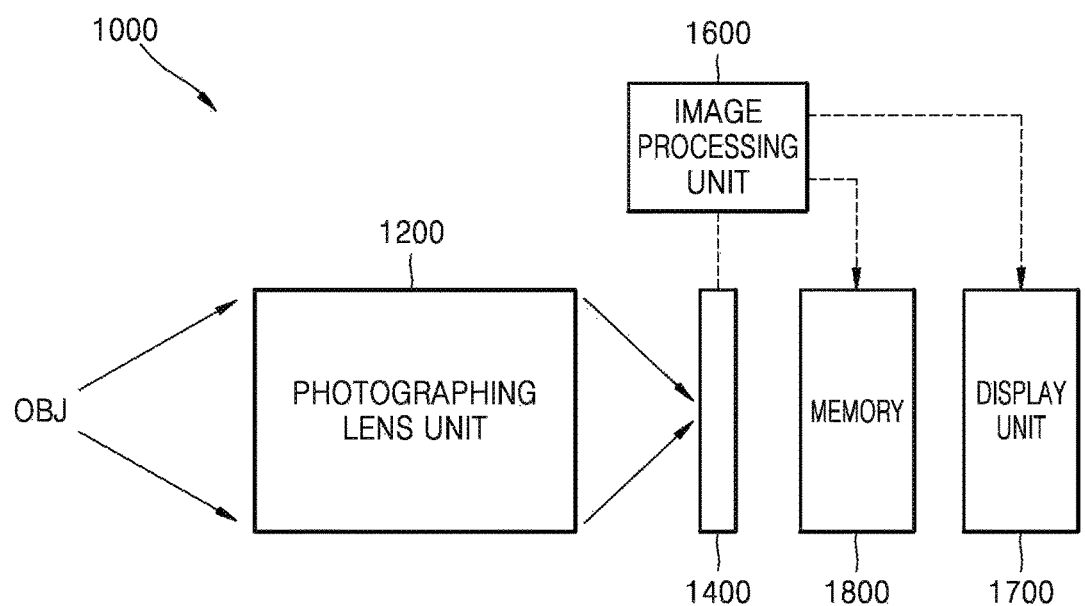
FIG. 23 is a block diagram illustrating a schematic configuration of an image pickup apparatus according to an exemplary embodiment.

FIG. 23 is a block diagram illustrating a schematic configuration of an image pickup apparatus 1000 according to an exemplary embodiment.

The image pickup apparatus 1000 according to an exemplary embodiment includes a photographing lens unit 1200 configured to generate an optical image by using (or focusing) a light reflected from an object OBJ, and an image sensor 1400 configured to convert the optical image formed by the photographing lens unit 1200 into an electrical signal. An infrared cut filter may be further provided between the image sensor 1400 and the photographing lens unit 1200.

The image sensor 1400 may be any one or any combination of the image sensors 1 to 14 according to the above exemplary embodiments.

Also, the image pickup apparatus 100 includes an image processing unit 1600 configured to process the electrical signal of the image sensor 1400 into an image signal. For example, the image processing unit 1600 generates an image by performing noise elimination and/or color interpolation on each color signal sensed by the image sensor 1400. Also, the image pickup apparatus 100 may further include a display unit 1700 configured to display the image formed by the image processing unit 1600, and a memory 1800 configured to store the image data generated by the image processing unit 1600.

As described above, since the color separation element of the image sensor 1400 separates the incident light according to the colors thereof and provides a result thereof to the pixel regions and the pixel region configured to sense the incident light includes both the horizontal structure and/or the stacked structure of the light sensing layers, the image sensor 1400 may improve the light efficiency and the color purity thereof.

Although a few embodiments have been shown and described, it would be appreciated by those skilled in the art that changes may be made in example embodiments without departing from the principles and spirit of the disclosure, the scope of which is defined in the claims and their equivalents.

What is claimed is:

1. An image sensor comprising:
   a first color separation element configured to separate an incident light, the incident light being separated into a mixture of a first color light and a third color light, and separated into a second color light; and
   a sensor array unit comprising a plurality of pixels configured to sense the separated incident light, the sensor array unit comprising a first pixel region and a second pixel region that are alternately arranged in a first direction and a second direction, the second direction crossing the first direction,
   wherein a stack of a first light sensing layer, configured to sense the first color light, and a third light sensing layer, configured to sense the third color light, is provided in the first pixel region, and a second light sensing layer configured to sense the second color light is provided in the second pixel region,
   wherein the first color separation element comprises a plurality of first color separation elements, and
   wherein one of longitudinal sides of one of the plurality of first color separation elements, when viewed in a plan view, is perpendicular to one of longitudinal sides of an adjacent first color separation element.

2. The image sensor of claim 1, wherein in the stack of the first light sensing layer and the third light sensing layer, a layer configured to sense a light having a shorter wavelength among the first light sensing layer and the third light sensing layer is disposed at a position closer to the first color separation element.

3. The image sensor of claim 1, wherein the first color separation element is disposed at a position facing the second pixel region, configured to allow the second color light to pass through the first color separation element and travel in a third direction toward the second pixel region, and configured to allow the mixture of the first color light and the third color light to pass through the first color separation element and travel in a fourth direction slanted with respect to the third direction.

4. The image sensor of claim 1, wherein the first color separation element, when viewed in the plan view, has a rectangular shape.

5. The image sensor of claim 4, wherein the one of the longitudinal sides of the one of the plurality of first color separation elements, when viewed in the plan view, extends along the first direction.

6. An image pickup apparatus comprising:
   a lens unit configured to generate an optical image based on a light reflected from an object; and
   the image sensor of claim 1, wherein the image sensor is configured to convert the optical image into an electrical signal.

7. An image sensor comprising:
   a first color separation element configured to separate an incident light, the incident light being separated into a mixture of a first color light and a third color light, and separated into a second color light; and
   a sensor array unit comprising a plurality of pixels configured to sense the separated incident light, the sensor array unit comprising a first pixel region and a second pixel region that are alternately arranged in a first direction and a second direction, the second direction crossing the first direction,
   wherein a stack of a first light sensing layer, configured to sense the first color light, and a third light sensing layer, configured to sense the third color light, is provided in the first pixel region, and a second light sensing layer configured to sense the second color light is provided in the second pixel region, wherein the first color separation element, when viewed in a plan view, has a shape of a cross.

8. The image sensor of claim 7, wherein a first line and a second line forming the shape of the cross extend in directions respectively parallel to the first direction and the second direction.

9. The image sensor of claim 7, wherein a first line and a second line forming the shape of the cross extend in directions respectively parallel to a first diagonal direction and a second diagonal direction of the second pixel region.

10. An image sensor comprising:
    a first color separation element configured to separate an incident light, the incident light being separated into a mixture of a first color light and a third color light, and separated into a second color light; and
    a sensor array unit comprising a plurality of pixels configured to sense the separated incident light, the sensor array unit comprising a first pixel region and a second pixel region that are alternately arranged in a first direction and a second direction, the second direction crossing the first direction,
    wherein a stack of a first light sensing layer, configured to sense the first color light, and a third light sensing layer, configured to sense the third color light, is provided in the first pixel region, and a second light sensing layer configured to sense the second color light is provided in the second pixel region,
    wherein the first color separation element is disposed at a position facing the first pixel region, configured to allow the mixture of the first color light and the third color light to pass through the first color separation element and travel in a third direction toward the first pixel region, and configured to allow the second color light to pass through the first color separation element and travel in a fourth direction slanted with respect to the third direction.

11. An image sensor comprising:
    a first color separation element configured to separate an incident light, the incident light being separated into a mixture of a first color light and a third color light, and separated into a second color light;
    a second color separation element;
    a sensor array unit comprising a plurality of pixels configured to sense the separated incident light, the sensor array unit comprising a first pixel region and a second pixel region that are alternately arranged in a first direction and a second direction, the second direction crossing the first direction, wherein a stack of a first light sensing layer, configured to sense the first color light, and a third light sensing layer, configured to sense the third color light, is provided in the first pixel region, and a second light sensing layer configured to sense the second color light is provided in the second pixel region, wherein the second color separation element is disposed to face the first pixel region, is configured to allow the mixture of the first color light and the third color light to pass through the second color separation element and travel in a third direction toward the first pixel region, and is configured to allow the second color light to pass through the second color separation element and travel in a fourth direction slanted with respect to the third direction.

12. The image sensor of claim 11, wherein the first color separation element and the second color separation element, when viewed in a plan view, have a rectangular shape.

13. The image sensor of claim 12, wherein longitudinal sides of the first color separation element and the second color separation element, when viewed in the plan view, are parallel to at least one of the first direction and the second direction.

14. The image sensor of claim 12, wherein
a longitudinal side of the first color separation element, when viewed in the plan view, is parallel to the first direction, and
a longitudinal side of the second color separation element, when viewed in the plan view, is parallel to the second direction.

15. The image sensor of claim 12, wherein longitudinal sides of the first color separation element and the second color separation element are respectively parallel to a diagonal direction of the second pixel region and a diagonal direction of the first pixel region.

16. The image sensor of claim 11, wherein the first color separation element and the second color separation element, when viewed in a plan view, have a shape of a cross.

17. The image sensor of claim 16, wherein a first line and a second line forming the shape of the cross extend in directions respectively parallel to the first direction and the second direction.

18. The image sensor of claim 16, wherein a first line and a second line forming the shape of the cross extend in directions respectively parallel to a first diagonal direction and a second diagonal direction of the first pixel region.

\* \* \* \* \*